(12) United States Patent
Hwang et al.

(10) Patent No.: US 12,248,001 B2
(45) Date of Patent: Mar. 11, 2025

(54) LIDLESS BGA SOCKET APPARATUS FOR TESTING SEMICONDUCTOR DEVICE

(71) Applicants: HICON CO., LTD., Gyeonggi-do (KR); Dong Weon Hwang, Gyeonggi-do (KR); Logan Jae Hwang, Flower Mound, TX (US); Jae Baek Hwang, Seoul (KR)

(72) Inventors: Dong Weon Hwang, Gyeonggi-do (KR); Logan Jae Hwang, Flower Mound, TX (US); Jae Baek Hwang, Seoul (KR)

(73) Assignees: HICON CO., LTD., Seongnam-si (KR); Dong Hwang, Seongnam-si (KR); Hwang Jae, Flower Mound, TX (US); Hwang Baek, Seoul (KR)

(*) Notice: Subject to any disclaimer, the term of this patent is extended or adjusted under 35 U.S.C. 154(b) by 462 days.

(21) Appl. No.: 17/441,512

(22) PCT Filed: Apr. 15, 2019

(86) PCT No.: PCT/KR2019/004494
§ 371 (c)(1),
(2) Date: Sep. 21, 2021

(87) PCT Pub. No.: WO2020/204245
PCT Pub. Date: Oct. 8, 2020

(65) Prior Publication Data
US 2022/0163561 A1    May 26, 2022

(30) Foreign Application Priority Data
Apr. 4, 2019 (KR) .................. 10-2019-0039833

(51) Int. Cl.
*G01R 1/04* (2006.01)
*G01R 1/073* (2006.01)
(Continued)

(52) U.S. Cl.
CPC ....... *G01R 1/0483* (2013.01); *G01R 1/07314* (2013.01); *G01R 31/2886* (2013.01); *H01R 13/62905* (2013.01); *H01R 2201/20* (2013.01)

(58) Field of Classification Search
CPC .............. G01R 1/0483; G01R 1/07314; H01R 13/63905; H01R 2201/20
See application file for complete search history.

(56) References Cited

U.S. PATENT DOCUMENTS 5,690,281 A * 11/1997 Ikeya .................. H05K 7/1007
439/268
6,072,322 A *  6/2000 Viswanath ......... G01R 31/2863
324/750.1
(Continued)

FOREIGN PATENT DOCUMENTS

| CN | 201656204 U | 11/2010 |
|---|---|---|
| JP | H11312566 A | 11/1999 |

(Continued)

OTHER PUBLICATIONS

Translation of KR 101944693 B1 (Year: 2019).*
Translation of KR 100799135 B1 (Year: 2008).*

*Primary Examiner* — Paresh Patel
(74) *Attorney, Agent, or Firm* — Klintworth & Rozenblat IP LLP

(57) ABSTRACT

The present invention relates to a BGA socket apparatus which is a lidless-type from which a cover, generally provided on the top part of a socket body in order for the loading/unloading operation of an IC, is removed, the BGA socket apparatus enabling the elimination of elements which may obstruct air flow during testing.

30 Claims, 44 Drawing Sheets

(51) Int. Cl.
*G01R 31/28* (2006.01)
*H01R 13/629* (2006.01)

(56) References Cited

U.S. PATENT DOCUMENTS

| | | | | |
|---|---|---|---|---|
| 6,126,467 | A * | 10/2000 | Ohashi | H05K 7/1084 |
| | | | | 439/268 |
| RE39,418 | E * | 12/2006 | Pfaff | H05K 7/1076 |
| | | | | 439/342 |
| 8,272,882 | B2 * | 9/2012 | Sakai | G01R 1/0483 |
| | | | | 439/268 |
| 2002/0004329 | A1 * | 1/2002 | Ikeya | H01R 13/193 |
| | | | | 439/259 |
| 2003/0054675 | A1 | 3/2003 | Ikeya | |
| 2005/0073330 | A1 * | 4/2005 | Huang | G01R 1/0466 |
| | | | | 324/750.25 |
| 2006/0046554 | A1 * | 3/2006 | Cram | H01R 13/62905 |
| | | | | 439/331 |
| 2008/0207036 | A1 * | 8/2008 | Hwang | G01R 1/0483 |
| | | | | 439/331 |
| 2017/0250484 | A1 * | 8/2017 | Sagano | H01L 23/32 |
| 2020/0176910 | A1 * | 6/2020 | Hwang | H01R 13/193 |

FOREIGN PATENT DOCUMENTS

| | | | | | |
|---|---|---|---|---|---|
| JP | 2000195631 | A | * | 7/2000 | ........... H01R 13/193 |
| JP | 2001210438 | A | * | 8/2001 | ........... H01R 13/193 |
| JP | 2002025731 | A | | 1/2002 | |
| JP | 2002203653 | A | | 7/2002 | |
| JP | 2002350493 | A | | 12/2002 | |
| JP | 2003007942 | A | | 1/2003 | |
| JP | 2003217775 | A | | 7/2003 | |
| KR | 200229127 | Y1 | | 7/2001 | |
| KR | 20020032359 | A | | 5/2002 | |
| KR | 20100005458 | U | | 5/2010 | |
| TW | 564578 | B | | 12/2003 | |

* cited by examiner prior art

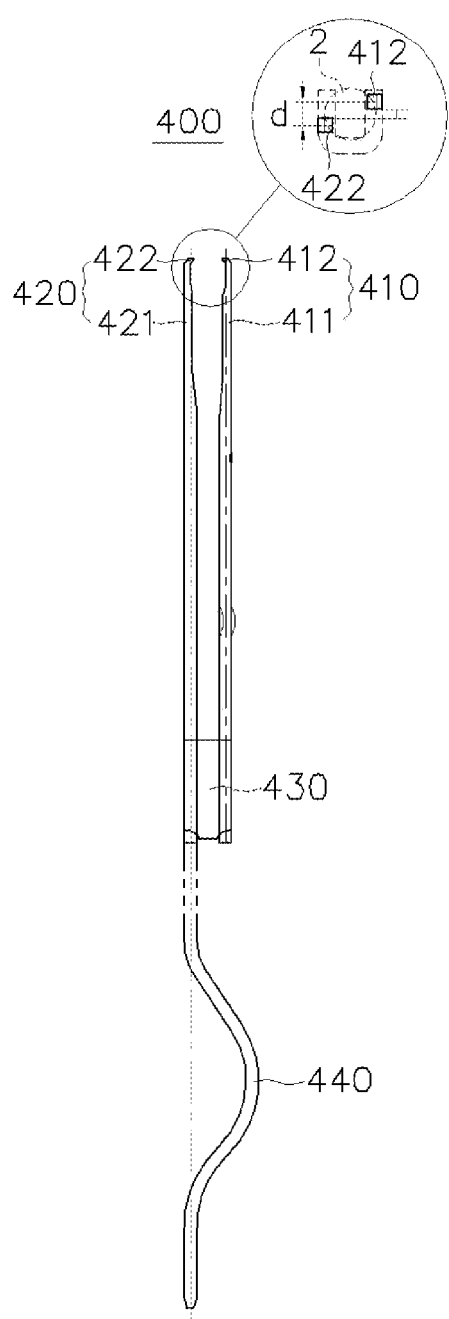
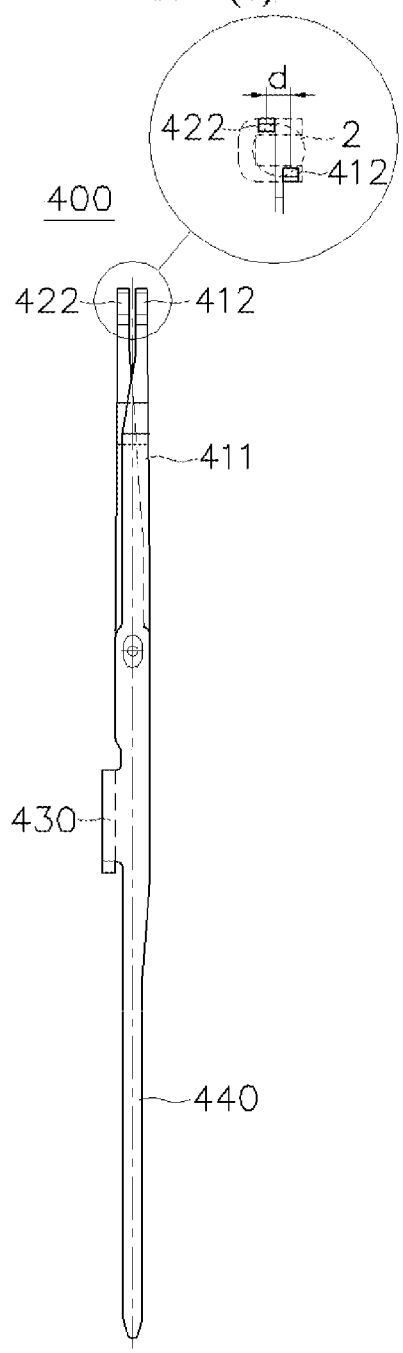

LIDLESS BGA SOCKET APPARATUS FOR TESTING SEMICONDUCTOR DEVICE

This is a National Stage Application of International Patent Application No. PCT/KR2019/004494, filed Apr. 15, 2019, which claims the benefit of and priority to Korean Application No. 10-2019-0039833, filed Apr. 4, 2019, the entirety of which are incorporated fully herein by reference.

TECHNICAL FIELD

The present disclosure relates generally to a BGA socket device for testing a BGA IC. More particularly, the present disclosure relates to a BGA socket device, which is a lidless type in which provision of a cover typically provided on top of a socket body for loading/unloading operations of an IC is eliminated, whereby factors that may impede flow of air during testing are eliminated.

BACKGROUND ART

In general, a socket for integrated circuits (hereinafter, referred to as an "IC") is mounted on a test board or a burn-in board. Such a socket is connected to measuring devices for measuring the properties of a burn-in chamber or peripheral devices and an IC, and is thus being used in a system for testing the IC. In this case, the burn-in chamber is used to input and output power and electric signals, which are required to drive the IC, through input/output (I/O) terminals provided on the board.

Among the ICs that have been widely used, a ball grid array (BGA) IC is defined as an IC in which conductive terminals, that is, solder balls, are uniformly arranged throughout a lower surface of the IC at regular intervals, thus remarkably reducing the size and thickness of the IC. FIGS. 1(a) and 1(b) are a plan view and a side view, respectively, illustrating a BGA IC, in which multiple solder balls 2 are provided on a lower surface of an IC 1.

FIG. 2 is a plan view illustrating a BGA socket device having pinch-type contacts according to the related art, FIG. 3 is a cross-sectional view taken along line A-A of FIG. 2, and FIG. 4 is a partially enlarged view of FIG. 3.

Referring to FIGS. 2 to 4, a BGA socket device according to the related art includes: contacts 16 each including a fixed terminal 20 and a movable terminal 21 that come into contact with each solder ball 2 of a BGA IC 1; a main body 17 accommodating bodies of the contacts 16; a stopper 18 provided on a lower surface of the main body 17 and supporting the contacts 16; a lead guide 19 guiding the positions of leads of the contacts 16; a cover 11 elastically supported on an upper surface of the main body 17 so as to be movable upward and downward within a predetermined stroke range with respect to the main body 17; a slider 15 provided on the upper surface of the main body 17 and configured to be movable leftward and rightward in cooperation with an upward-and-downward movement of the cover 11, thus opening and closing the movable terminal 21; multiple IC holders 14 rotatably assembled to the slider 15 and configured to press-hold an upper surface of the IC 1 in cooperation with the upward-and-downward movement of the cover 11; and holder springs 13 provided in the slider 15 and elastically supporting the IC holders 14.

The contact 16 is configured such that the fixed terminal 20 and the movable terminal 21 are bilaterally symmetrically provided to come into contact with the solder ball 2 of the IC. The contact 16 includes a contact body 24 in which lower end portions of the fixed terminal 20 and the movable terminal 21 are fixed, and a lead extending from the contact body 24. The lead 25 is soldered to a printed circuit board (PCB, not shown).

The cover 11 is elastically supported on the upper surface of the socket body 17 by springs 9 so as to be movable upward and downward within a predetermined distance and is provided with slider cams for operating the slider 15 leftward and rightward in accordance with an upward-and-downward position.

The slider 15 includes a terminal hole 23 in which the two terminals 20 and 21 of the contact 16 that are vertically fixed to the contact body 17 are received by passing therethrough. Herein, the terminal hole 23 has a movable piece 22 provided to separate the fixed terminal 20 and the movable terminal 21 from each other.

Particularly referring to FIG. 4, when the cover is pressed downward, the slider 15 is moved rightward by the slider cams of the cover. Herein, the movable piece 22 is moved theretogether to open the movable terminal 21 outward, causing the solder ball 2 of the IC to be located between the fixed terminal 20 and the movable terminal 21. Meanwhile, the distance between the fixed terminal 20 and the movable terminal 21 separated with the movable piece 22 interposed therebetween at an initial position of the slider 15 is designed to be smaller than the size (diameter) of the solder ball.

Reference numeral 12 denotes an IC guide for guiding the IC□s position when the IC 1 is loaded.

FIGS. 5(a), 5(b), and 5(c) are views illustrating a schematic operation example of the BGA socket device according to the related art.

FIG. 5(a) illustrates an initial state in which the cover 11 is elastically supported on the main body 17 and thus is located at a predetermined height, and the fixed terminal 20 and the movable terminal 21 of the contact are in close contact with the movable piece 22 and thus maintain a predetermined interval L1 between the two terminals 20 and 21.

Next, as illustrated in FIG. 5(b), when the cover 11 is pressed and moved downward, the movable piece 22 is moved to the right side of the figure together with the slider, causing the movable terminal 21 to be opened outward, whereby the IC 1 is loaded into the socket device. Herein, the distance L2 between the two terminals 20 and 21 is larger than the diameter of the solder ball 2.

Lastly, as illustrated in FIG. 5(c), when the cover 11 is returned to an original position thereof, the movable piece 22 is returned to an initial position thereof together with the slider, causing the movable terminal 21 to be returned to an original position thereof, whereby the fixed terminal 20 and the movable terminal 21 grip the solder ball 2.

The BGA socket device according to the related art configured as described above has the following problems.

1. The entire components may be many and complicated, which may cause long assembly time and high cost.

2. Due to the structure in which the cover or lead guide surrounds the IC in a state in which the IC is loaded, air flow may not be efficient and heat generated from the IC may not be effectively dissipated to surrounding air.

3. The height of the socket is high, including the cover on top to be operated upward and downward, resulting in that the overall height of a burn-in board is high. Accordingly, in a case where multiple burn-in boards are disposed in a burn-in chamber in upward and downward directions and proper air flow is required between each board, the number of burn-in boards that can be placed may be reduced.

4. The forced flow of air generated in the burn-in chamber may be impeded by the cover or lead guide, which is a component of the socket itself, and the forced flow of air may not be effectively transmitted to the surface of the IC. Therefore, it may be difficult to keep the temperature of the IC uniform.

5. In a pinch-type contact, contact and release of the contact with/from the solder ball of the IC is made by horizontal operation of the movable terminal. Herein, the movable terminal may undergo repeated elastic deformation, leading to a decrease in contact force with the solder ball due to a decrease in durability due to repeated use. Particularly, in the BGA socket device according to the related art, returning of the slider to the initial position thereof in the process of returning the movable terminal (see FIG. 5(c)) is performed on the basis of a mechanism where an operating force is generated by an elastic restoring force of the movable terminal. Therefore, as the number of times of use of the movable terminal increases, the contact force with the solder ball may be decreased due to a gradual decrease in the elastic restoring force of the movable terminal due to the stress acting thereon, which may lead to lower the reliability in testing an IC.

Typically, a pinch-type BGA socket device is required to have a life span of about 20,000 cover cycles. Due to this, in the pinch-type contacts, preventing the elastic restoring force of the movable terminal from being decreased by improving the durability of the terminal during repeated use is crucial in determining the test reliability of the BGA socket device.

DOCUMENTS OF RELATED ART

Patent Document

Korean Utility Model Registration No. 20-0229127 (published on Jul. 19, 2001)

DISCLOSURE

Technical Problem

Accordingly, the present disclosure has been made keeping in mind the above problems occurring in the related art, and an objective of the present disclosure is to provide a BGA socket device for testing a BGA IC, the socket device being a lidless type in which provision of a cover typically provided on top of a socket body for loading/unloading operations of the IC is eliminated, whereby the IC loaded onto the socket body is subjected to testing in a state of being exposed outside the socket body.

Another objective of the present disclosure is to provide a means for improving heat dissipation effect of an IC during testing of the IC using the BGA socket device.

Technical Solution

In order to achieve the above objectives, according to one aspect of the present disclosure, there is provided a lidless BGA socket device for testing a BGA IC, the lidless BGA socket device including: a contact having an elastic force exerted in a lateral direction and including an upper tip, the contact coming into electrical contact with each solder ball of the IC; a main body including a slider receiving portion depressed in an horizontal upper surface thereof, and a cam supporting portion formed in the upper surface at a location corresponding to a peripheral portion of the slider receiving portion to define an end inner surface, the main body being configured such that the contact is fixed to a lower surface of the slider receiving portion; a slider enabling forward and backward sliding in a horizontal direction in the slider receiving portion, and including a cam contact portion provided at an end thereof while facing the cam supporting portion such that the forward and backward sliding is performed in response to a lateral operating force applied to the cam contact portion, the slider transmitting the lateral operating force to the contact in accordance with forward and backward sliding positions thereof to allow the solder ball of the IC and the contact to come into contact with each other; and a contact force generating spring provided between the main body and the slider, and elastically supporting the slider in a moving direction to provide a contact force between the contact and the solder ball of the IC.

According to another aspect of the present disclosure, there is provided a lidless BGA socket device for testing a BGA IC, the lidless BGA socket device including: a contact having an elastic force exerted in a lateral direction and including an upper tip, the contact coming into electrical contact with each solder ball of the IC; a main body including an IC seat portion provided on a horizontal upper surface thereof and allowing the IC to be seated thereon, and a slider receiving portion depressed in the upper surface, the main body being configured such that the contact is fixed to a lower surface of the slider receiving portion; a slider received in the slider receiving portion so as to be slidable upward and downward and enabling upward and downward sliding in response to application of a vertical operating force applied to the slider in a vertical direction, the slider transmitting a lateral operating force to the contact in accordance with upward and downward sliding positions thereof to allow the contact and each solder ball of the IC to come into contact with each other; and a contact force generating spring provided between the main body and the slider, and elastically supporting the slider in a moving direction to provide a contact force between the contact and the solder ball of the IC.

In a preferred embodiment, the lidless BGA socket device may further include an IC loading/unloading device detachably assembled to an upper end of the main body by fitting, and loading and unloading the IC by allowing the slider to be moved in a lateral direction or in an upward-and-downward direction.

According to still another aspect of the present disclosure, there is provided a heat sink unit, including: a housing including an opening formed therethrough, a first hook protrusion protruding downward from a peripheral portion of the opening, and a second hook protrusion fitted and locked to the socket device; a heat sink inserted into the opening so as to be movable upward and downward, and having a moving distance that is limited by the first hook protrusion; and a spring interposed between the housing and the heat sink, and elastically supporting the heat sink downward.

According to still another aspect of the present disclosure, there is provided a heat sink socket for mounting a heat sink unit for heat dissipation of an IC to a socket device that is used for testing the IC and assembled to a PCB, the heat sink socket including: a frame fixed to the PCB, and having a quadrangular shape in which an opening is formed to allow the socket device to be placed therein; and a pair of locking arms extending upward from opposite sides of the frame, respectively, and allowed to be assembled to the heat sink unit by fitting, wherein each of the locking arms includes: an arm member extending vertically from the frame; a locking end protruding inward from an upper end of the arm member; and a release groove depressed outward from the upper end of the arm member.

Advantageous Effects

The lidless BGA socket device for testing the BGA IC according to the present disclosure is characterized by including: the contacts; the main body including the slider receiving portion depressed in the horizontal upper surface, and configured such that the contacts are fixed to the lower surface of the slider receiving portion; the slider being slidable in the slider receiving portion in the horizontal or vertical direction and enabling forward and backward or upward and downward sliding in response to application of a horizontal or vertical operating force, and transmitting a lateral operating force to the contacts in accordance with forward and backward or upward and downward sliding positions thereof to allow the solder balls of the IC and the contacts to come into contact with each other; and the contact force generating spring provided between the main body and the slider, and elastically supporting the slider in a moving direction to provide a contact force between the contacts and the solder balls of the IC. The present disclosure having the above-configuration allows a separate IC loading/unloading device to be temporarily assembled to the main body only during loading/unloading of the IC, thus providing an advantage in that during testing, the temperature of the IC can be kept uniform by eliminating provision of a structure that may impede flow of air around the IC loaded onto the socket device. Furthermore, the present disclosure provides an advantage in that compared with the related art, the height of the socket device can be reduced in half, thus increasing the number of burn-in boards that can be disposed in a burn-in chamber, resulting in reduced testing costs.

Furthermore, the present disclosure provides an advantage in that a uniform contact between the contacts and the solder balls of the IC can be maintained for a long time, and degrading of the contacts due to a decrease in the elastic restoring force of the contacts can be reduced.

Furthermore, the present disclosure provides an advantage in that a heat sink can be detachably selectively mounted to the socket device, thus efficiently dissipating heat generated from the IC during testing of the IC.

DESCRIPTION OF DRAWINGS

FIGS. 23(a) and 23(b) are a front view and a side view, respectively, illustrating a dual pinch type contact according to another embodiment of the present disclosure.

BEST MODE

All terms or words used in the specification and claims have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Specific structural and functional descriptions of embodiments of the present disclosure disclosed herein are only for illustrative purposes of exemplary embodiments of the present disclosure, and the present description is not intended to represent all of the technical spirit of the present disclosure. On the contrary, the present disclosure is intended to cover not only the exemplary embodiments, but also various alternatives, modifications, equivalents, and other embodiments that may be included within the spirit and scope of the present disclosure as defined by the appended claims.

Hereinbelow, exemplary embodiments of the present disclosure will be described in detail with reference to the accompanying drawings.

First Embodiment

Figure 1A:
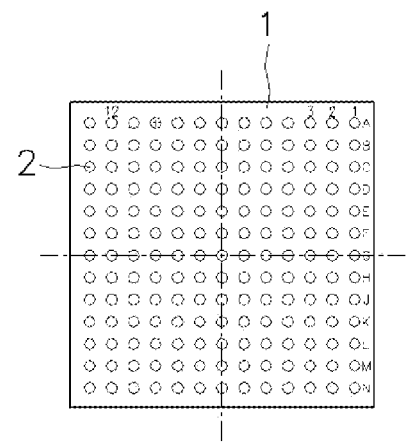
FIGS. 1(a) and 1(b) are a plan view and a side view, respectively, illustrating a BGA IC.
Figure 1B:
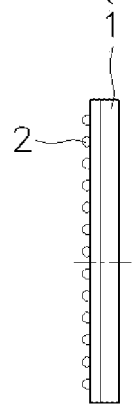
Figure 2:
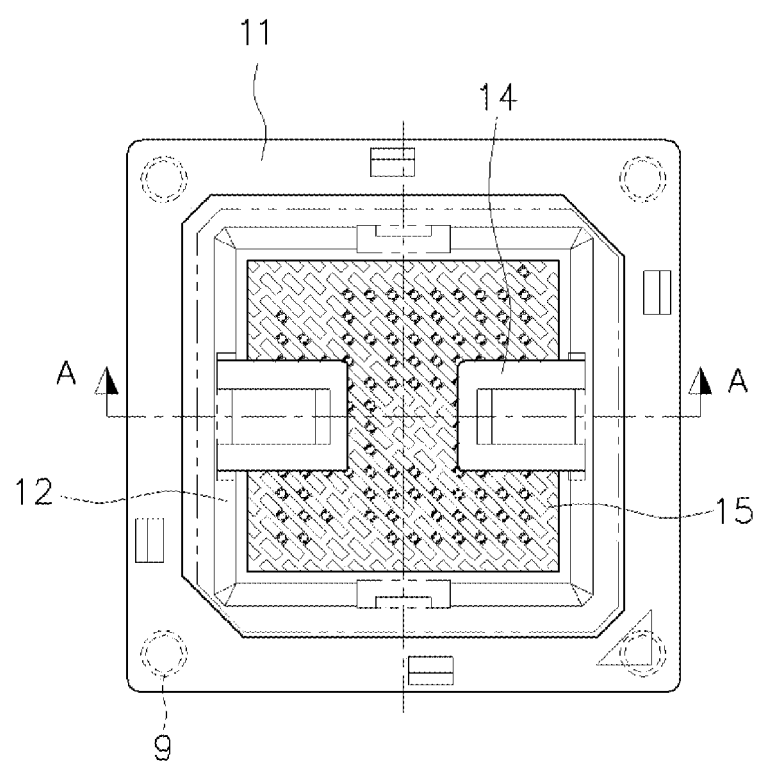
FIG. 2 is a plan view illustrating a socket device according to the related art.
Figure 3:
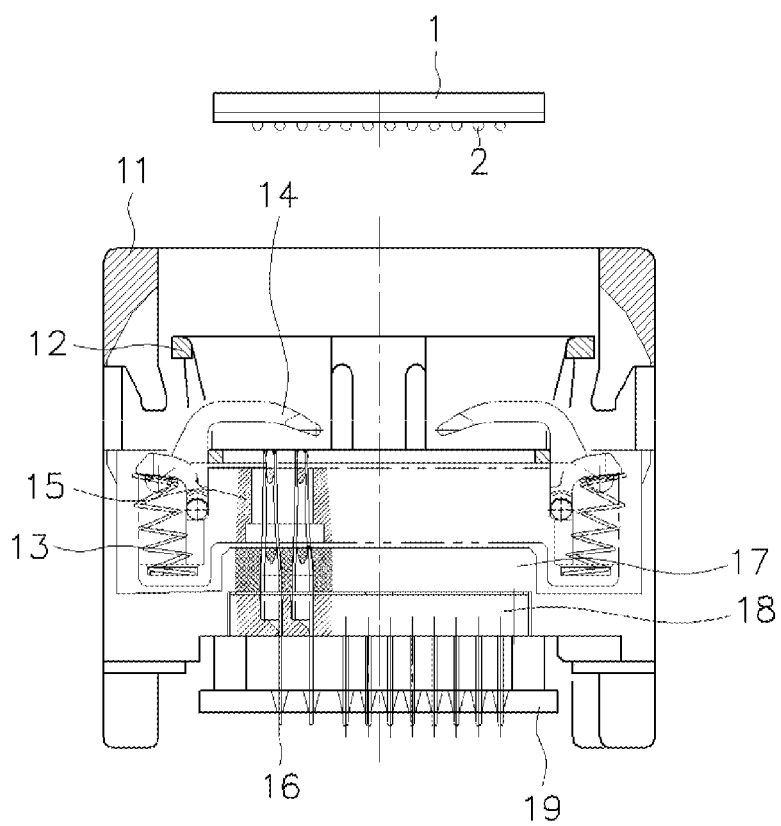
FIG. 3 is a cross-sectional view taken along line A-A in FIG. 2.
Figure 4:
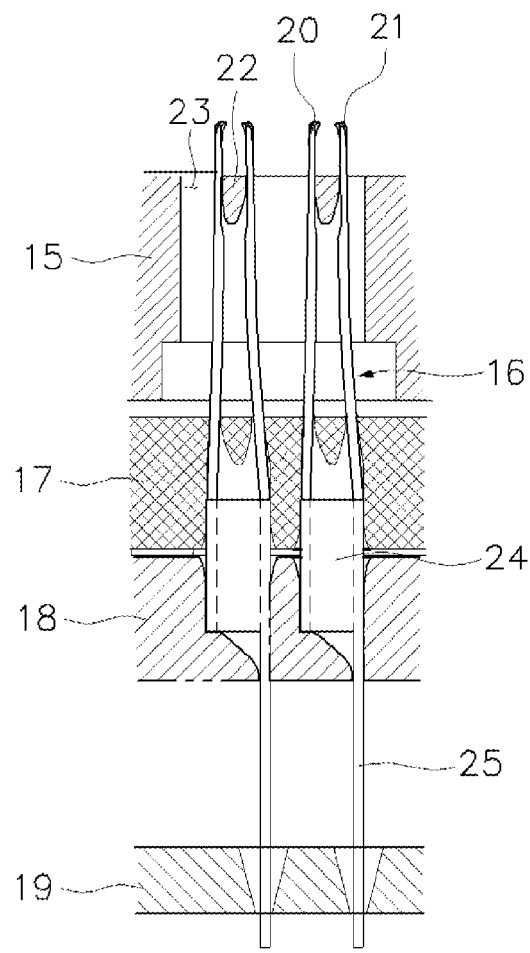
FIG. 4 is a partial enlarged view of FIG. 3.
Figure 5A:
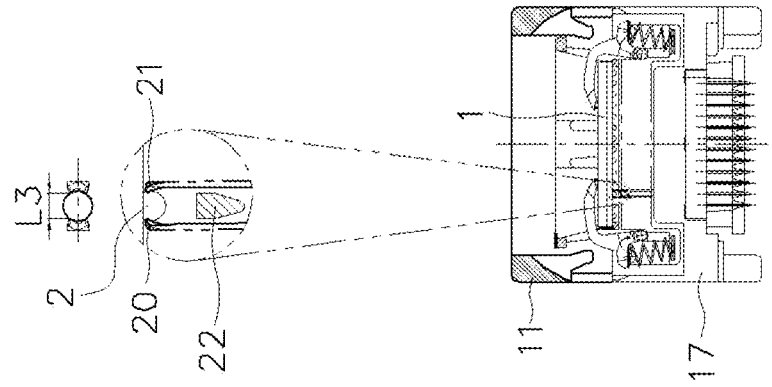
FIGS. 5(a), 5(b), and 5(c) are views illustrating a schematic operation example of the socket device according to the related art.
Figure 5B:
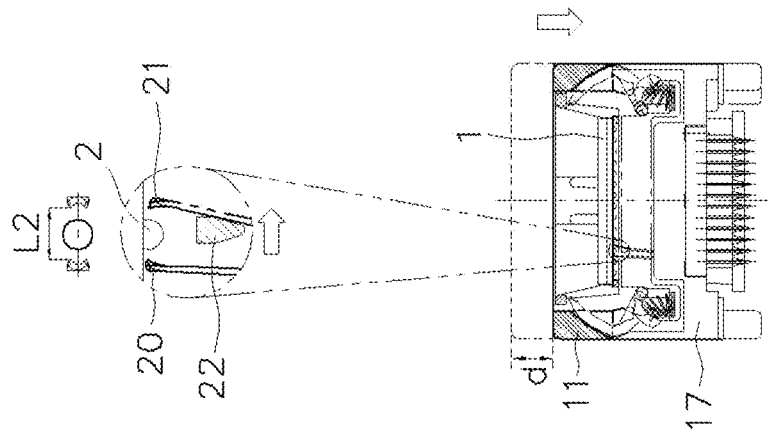
Figure 5C:
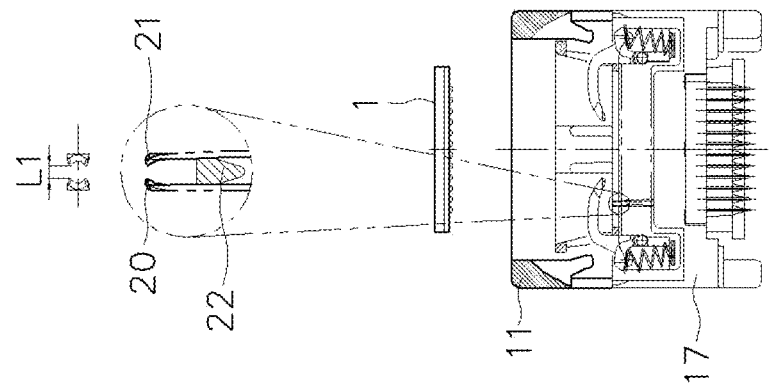
Figure 6:
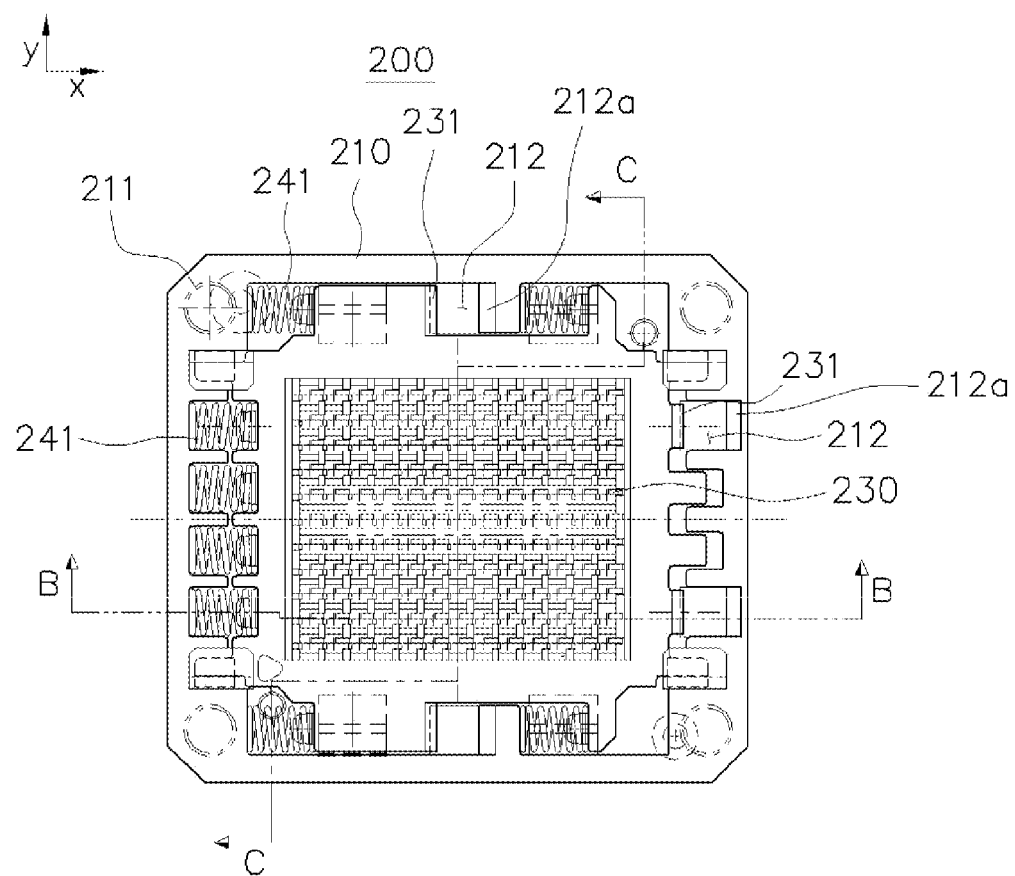
FIG. 6 is a plan view illustrating a lidless BGA socket device according to a first embodiment of the present disclosure.
Figure 7:
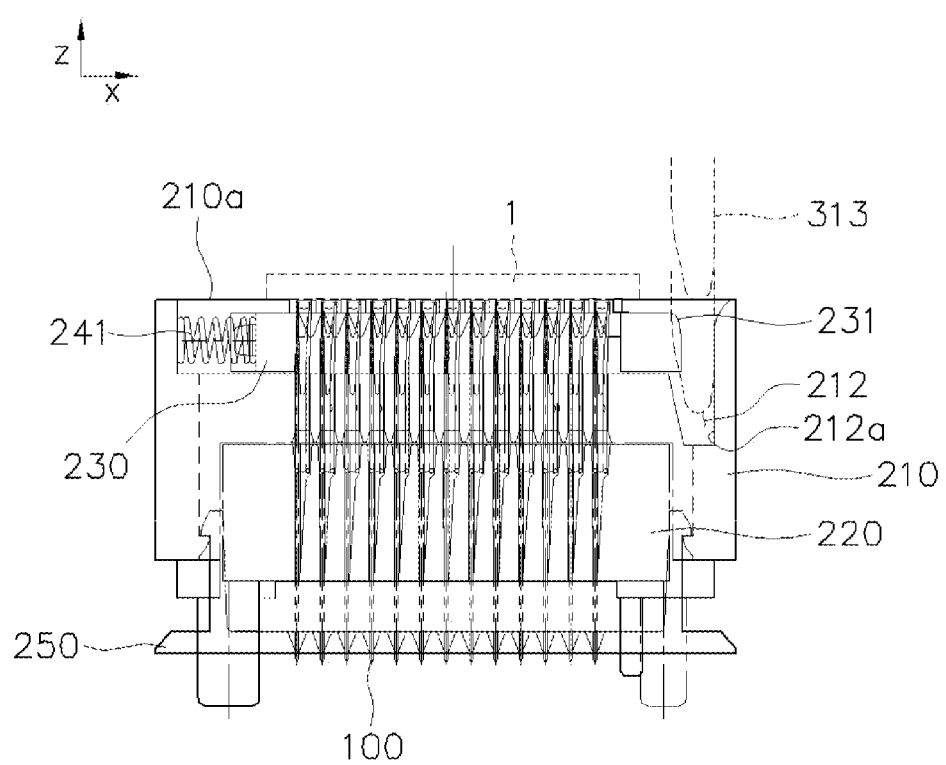
FIG. 7 is a cross-sectional view taken along line B-B in FIG. 6.
Figure 8:
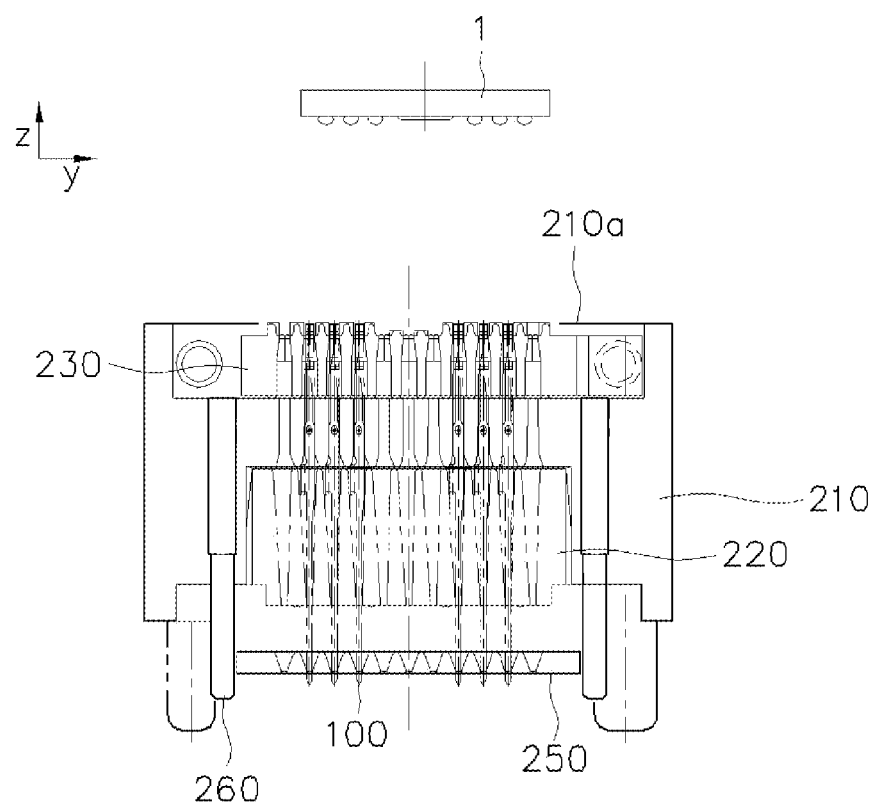
FIG. 8 is a cross-sectional view taken along line C-C in FIG. 6.

FIG. 6 is a plan view showing a lidless BGA socket device (hereinafter also referred to as "socket device") according to a first embodiment of the present disclosure, FIG. 7 is a cross-sectional view taken along line B-B in FIG. 6, and FIG. 8 is a cross-sectional view taken along line C-C in FIG. 6.

Referring to FIGS. 6 and 8, a socket device 200 according to the present embodiment includes a contact 100 including an upper tip and having an elastic force exerted in a lateral direction, the contact coming into electrical contact with each solder ball 2 of an IC 1; a main body 210 including a slider receiving portion 210b depressed in an horizontal upper surface 210a, and a cam supporting portion 212a formed in the upper surface 210a at a location corresponding to a peripheral portion of the slider receiving portion 210b to define an end inner surface, the main body being config-ured such that contacts are fixed to a lower surface of the slider receiving portion 210b; a slider 230 enabling forward and backward sliding in a horizontal direction (x-axis direction) in the slider receiving portion 210b provided in an upper portion of the main body 210, and including a cam contact portion 231 provided at an end thereof while facing the cam supporting portion 212a such that the forward and backward sliding is performed in response to a lateral operating force applied to the cam contact portion 231, the slider transmitting the lateral operating force to the contacts 100 in accordance with forward and backward sliding positions thereof to allow solder balls 2 of the IC 1 and the contacts 100 to come into contact with each other; and a contact force generating spring 241 provided between the main body 210 and the slider 230, and elastically supporting the slider 230 in a moving direction (x-axis direction) to provide a contact force between the contacts 100 and the solder balls 2 of the IC 1.

In the present disclosure, the contacts 100 may be dual pinch type or single pin type contacts. In the present embodiment, dual pinch type contacts are illustrated, and a detailed configuration thereof will be described with reference to related drawings.

The main body 210 includes the horizontal upper surface 210a. The upper surface 210a has a central portion including the depressed slider receiving portion 210b in which the slider 230 is received. The upper surface 210a includes a guide hole 211 and a recessed hole 212 that are provided at locations corresponding to peripheral portions of the slider receiving portion 210b.

The guide hole 211 is for assembly with an IC loading/unloading device for loading/unloading operations of the IC and serves to guide an assembly position of the IC loading/unloading device. Although FIG. 6 illustrates that four guide holes are provided at respective corners of the main body 210, the locations and numbers thereof may vary.

In particular, referring to FIG. 7, the hole 212 provides a hole into which a slider actuating cam 313 of the IC loading/unloading device is inserted, and an end inner surface of the hole 212 serves as the cam supporting portion 212a supporting the slider actuating cam 313 in a state of being coming into contact with the slider actuating cam 313. The slider 230 includes the cam contact portion 231 having a curved shape and provided at a location at an upper end edge thereof facing the cam supporting portion 212a. When the slider actuating cam 313 is inserted between the cam contact portion 231 and the cam supporting portion 212a, the slider actuating cam 313 vertically presses the cam contact portion 231 in a state of being supported by the cam supporting portion 212a. Then, the lateral operating force is generated by a vertical operating force of the slider actuating cam 313 to be applied to the curved-shaped cam contact portion 231, causing the slider 230 to be moved in the horizontal direction (x-axis direction).

Referring to FIG. 6, in the present embodiment, four cam contact portions 231 are provided at upper and lower symmetrical locations on the slider 230, and four cam supporting portions 212a are provided at upper and lower symmetrical locations on the main body 210. However, the locations and numbers thereof may vary.

The socket device may further include a stopper body 220 provided at a lower end of the main body 210 for fixing the contacts 100. The contacts 100 may be temporarily assembled to the stopper body 220 and then assembled to the main body 210, whereby the contacts 100 may be fixed to the main body 210 perpendicularly thereto. On the other hand, in another modification, the contacts may be directly press-fitted to the main body, such that the contacts may be fixed only by the main body without provision of the stopper body.

The socket device may further include a lead guide 250 provided at a location under the stopper body 220 and through which a lead of each contact is inserted. The lead guide 250 guides the lead such that the lead of the contact is correctly inserted into a through hole of a PCB in the process of assembling the socket device to the PCB. Reference numeral 260 denotes a soldering pin, which extends below the main body to be soldered to the PCB to firmly fix the socket device to the PCB.

The slider 230 is assembled to an upper portion of the main body 210 so as to be slidable in a leftward-and-rightward direction (x-axis direction). The slider 230 includes the cam contact portions 231 having a curved shape at the upper end edge thereof correspondingly to the cam supporting portions 212*a* of the main body 210, such that the slider 230 opens and closes the contacts 100 in horizontal directions in accordance with the forward and backward sliding positions.

The contact force generating spring 241 is provided between the main body 210 and the slider 230. The contact force generating spring elastically supports the slider 230 in the moving direction (x-axis direction) to provide the contact force between the contacts 100 and the solder balls of the IC. Multiple contact force generating springs 241 may be provided to secure a sufficient operating force. For reference, in FIG. 6, eight contact force generating springs 241 are arranged at upper and lower symmetrical locations to bias press the slider 230 rightward.

In the socket device 200 configured as described above, the IC loading/unloading device is temporarily assembled to the upper portion of the main body 210 only during loading/unloading of the IC to perform a loading/unloading operation of the IC. Then, testing is performed in a state in which the upper portion of the main body 210 on which the IC 1 is seated is open, without a separate structure. Hereinafter, specific embodiments of each component will be described.

Figure 9A:
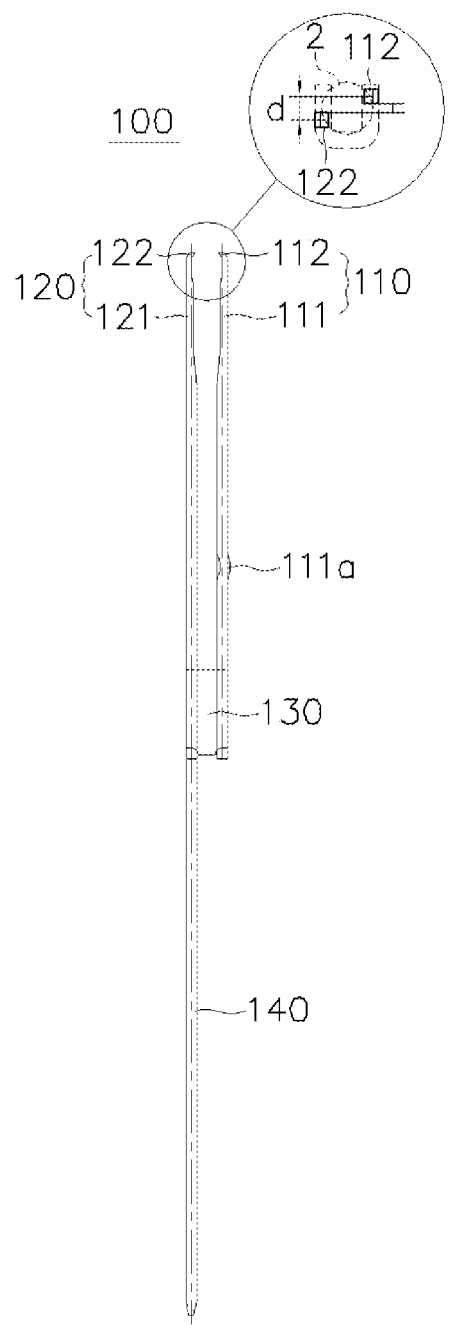
FIGS. 9(a) and 9(b) are a front view and a side view, respectively, illustrating a dual pinch type contact in the first embodiment of the present disclosure.
Figure 9B:
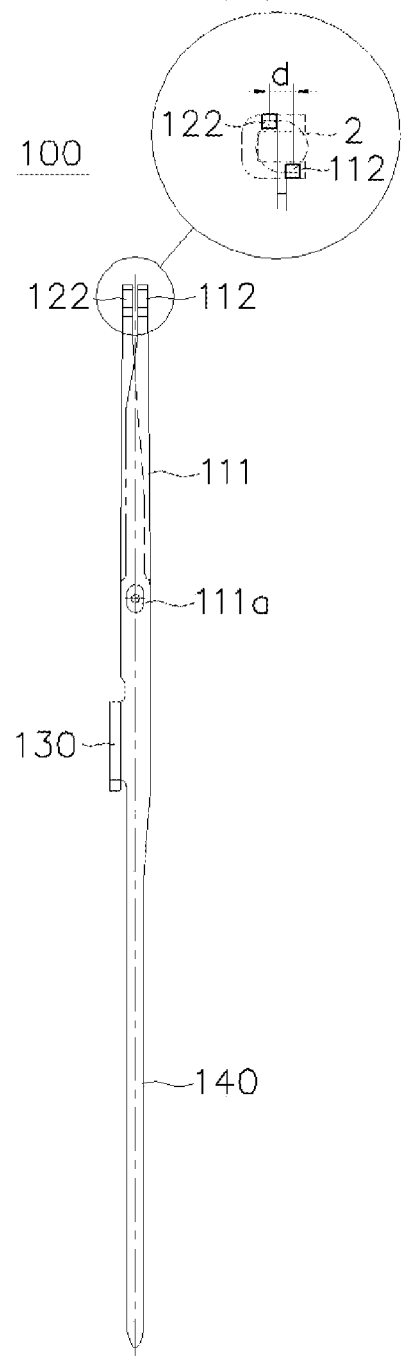

FIGS. 9(*a*) and 9(*b*) are a front view and a side view, respectively, illustrating a dual pinch type contact in the first embodiment of the present disclosure.

Referring to FIGS. 9(*a*) and 9(*b*), each of the contacts 100 of the present embodiment is a dual pinch type contact, including a pair of fixed terminal 110 and movable terminal 120 that are disposed so as to face each other with each solder ball 2 of the IC interposed therebetween. The contact 100 includes a contact body 130 to which lower ends of the fixed and movable terminals 110 and 120 are integrally fixed, and a lead 140 extending downward from the contact body 130. The lead 140 is assembled to a through hole of a printed circuit board (PCB, not shown) and fixed by soldering.

The fixed terminal 110 includes a pin 111 and an upper tip 112 provided at an upper end of the pin 111 and coming into direct contact with the solder ball 2 of the IC. Similarly, the movable terminal 120 includes a pin 121 and an upper tip 122 provided at an upper end of the pin 121.

The pin 111 may be provided with a support protrusion 111*a* protruding outward from a middle portion thereof. The support protrusion 111*a* functions to support the fixed terminal 110 in the horizontal direction when located in a receiving hole of the main body by being supported on an inner surface thereof.

It is preferable that the upper tips 112 and 122 are offset from each other by a predetermined distance d with respect to the center of the solder ball 2. Therefore, in the dual pinch type contact according to the present disclosure, each of the contacts comes into contact with each solder ball 2 of the IC such that the upper tips 112 and 122 thereof are offset from each other by the predetermined distance d with respect to the solder ball 2.

Figure 10:
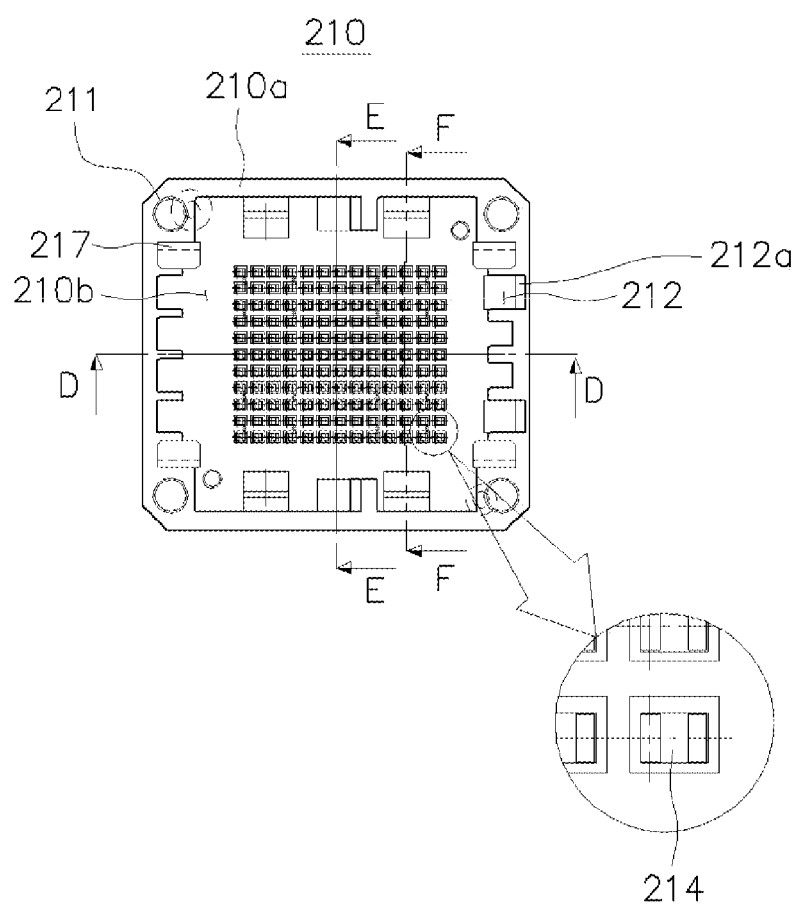
FIG. 10 is a plan view illustrating a main body in the first embodiment of the present disclosure.
Figure 11:
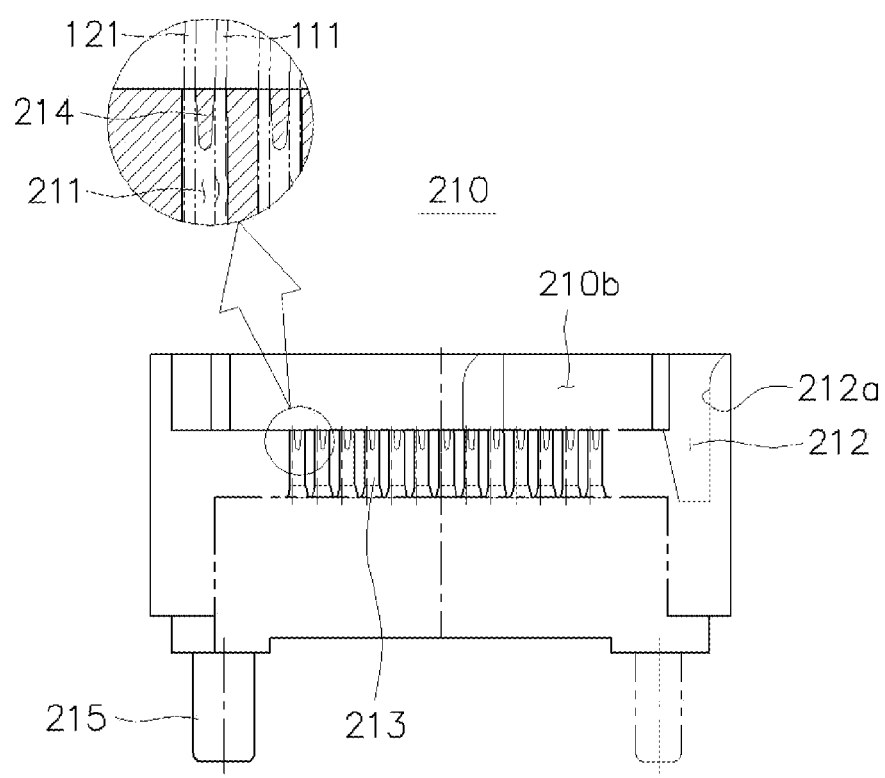
FIG. 11 is a cross-sectional view taken along line D-D in FIG. 10.
Figure 12A:
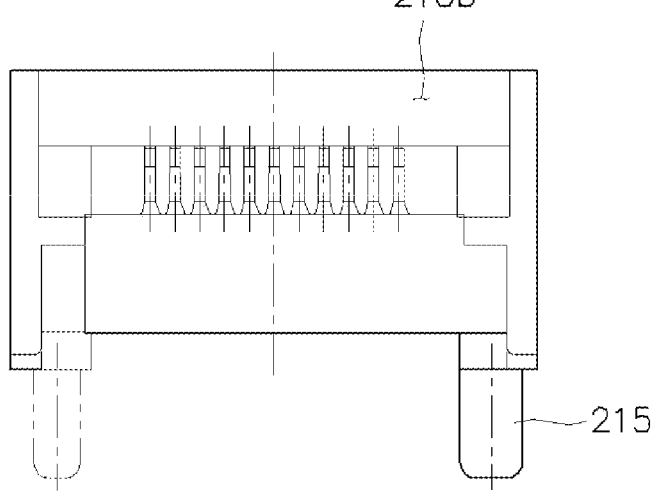
FIGS. 12(a) and 12(b) are cross-sectional views taken along line E-E and line F-F in FIG. 10, respectively.
Figure 12B:
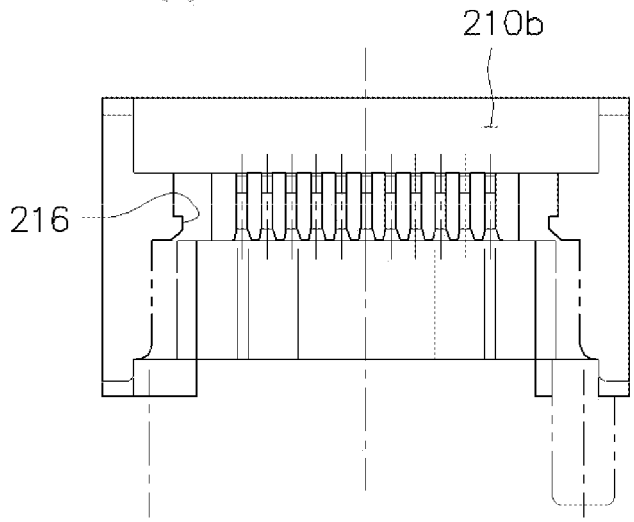

FIG. 10 is a plan view illustrating a main body in the first embodiment of the present disclosure, FIG. 11 is a cross-sectional view taken along line D-D in FIG. 10, and FIGS. 12(*a*) and 12(*b*) are cross-sectional views taken along line E-E and line F-F in FIG. 10, respectively.

Referring to FIGS. 10 to 12, the main body 210 includes the slider receiving portion 210*b* depressed in the center of the upper surface 210*a* to receive the slider therein. In a lower surface of the slider receiving portion 210*b*, multiple first receiving holes 213 are formed vertically therethrough in a predetermined pattern such that the contacts are vertically received in the respective first receiving holes 213. Each of the receiving holes 213 has a fixed piece 214 provided at an upper open end thereof between the pins 111 and 121 such that the pins 111 and 121 are fixed horizontally in the main body 210.

In the main body 210, a portion of the upper surface 210*a*, which defines a peripheral portion of the slider receiving portion 210, has a horizontally flat surface structure, and multiple guide holes 211 are formed in the upper surface 210*a*. The slider receiving portion 210*b* includes recessed holes 212. Each of the holes 212 has an end inner surface, which functions as each of the cam supporting portions 212*a*. The cam supporting portions 212*a* serve to support slider actuating cams of the IC loading/unloading device. As shown in FIG. 11, an upper end surface of each of the cam supporting portions 212*a* provides a curved surface for allowing each of the slider actuating cams of the IC loading/unloading device to be inserted into the hole 212 therealong.

The main body 210 includes a guide pin 215 protruding from a lower portion thereof. The guide pin 215 guides a mounting position with respect to the PCB during assembly with the PCB. One or multiple guide pins 215 may be provided.

The main body 210 includes first locking protrusions 216 partially protruding from the inner surface of the main body 210. The first locking protrusions 216 are used as assembling members for fitting to the stopper body 220.

Reference numeral 217 denotes a hook locking step, which locks each locking hook of the slider to guide forward and backward moving directions of the slider assembled to the upper portion of the main body 210.

Figure 13:
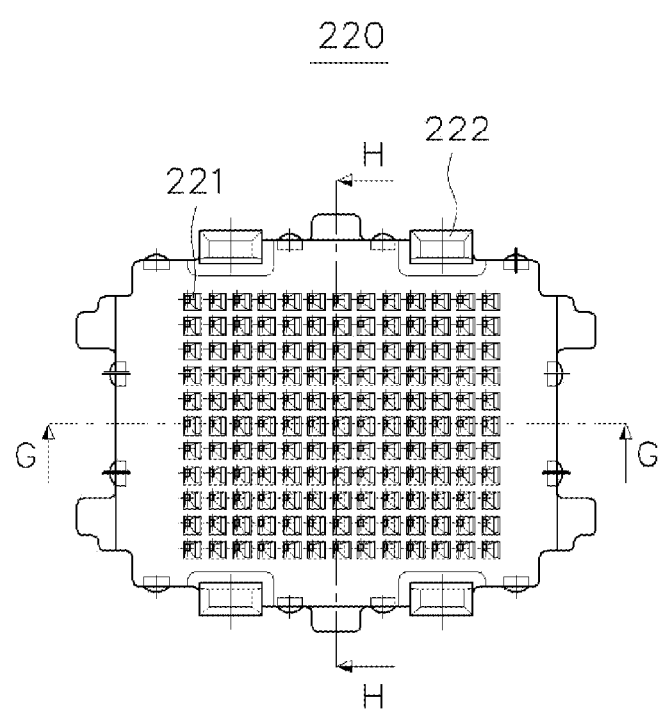
FIG. 13 is a plan view illustrating a stopper body in the first embodiment of the present disclosure.
Figure 14A:
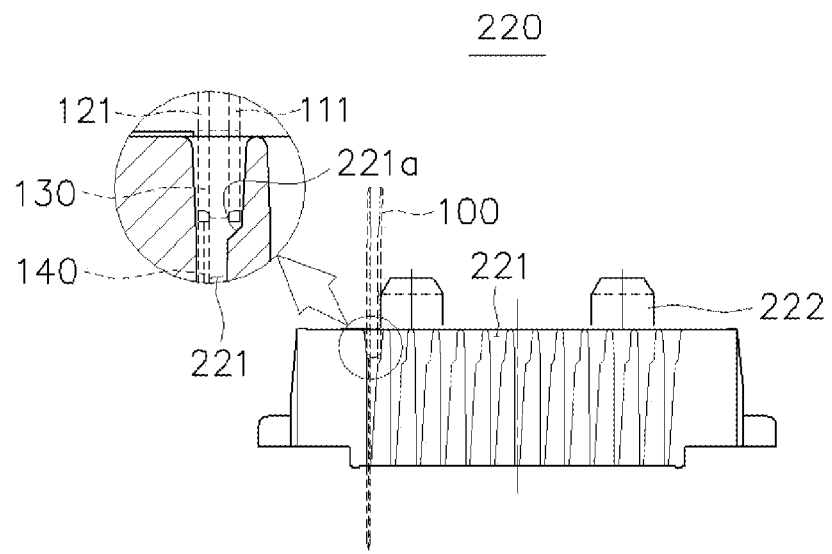
FIGS. 14(a) and 14(b) are cross-sectional views taken along line G-G and line H-H in FIG. 13, respectively.
Figure 14B:
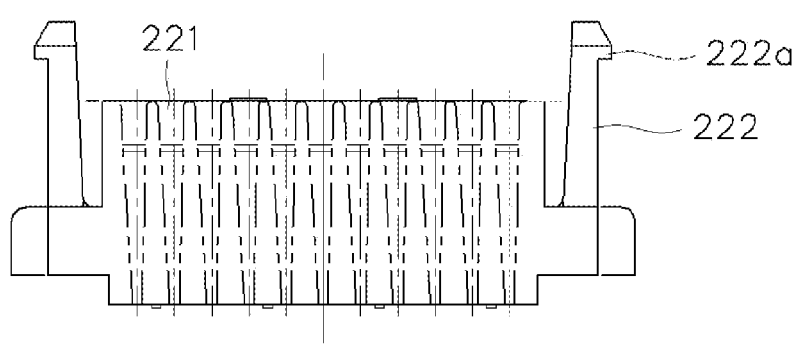

FIG. 13 is a plan view illustrating a stopper body in the first embodiment of the present disclosure, and FIGS. 14(*a*) and 14(*b*) are cross-sectional views taken along line G-G and line H-H in FIG. 13, respectively.

Referring to FIGS. 13 to 14, the stopper body 220 includes multiple second receiving holes 221 formed vertically therethrough in a predetermined pattern, and the contacts 100 are vertically fixed in the respective second receiving holes 221. The second receiving holes 221 are provided at substantially the same locations as the first receiving holes of the main body such that the contacts 100 are vertically located.

It is preferable that each of the second receiving holes 221 is configured such that the inner diameter thereof decreases downward and an inclined support surface 221*a* having a predetermined inclination is provided on an inner surface thereof. The contact body 130 is supported by the inclined support surface 221*a* while the lead 140 protrudes downward from the second receiving hole 221.

The stopper body 220 includes multiple locking arms 222 extending vertically. Each of the locking arms 222 includes a second locking protrusion 222a provided at an upper end of thereof. The second locking protrusions 222a are fitted to the first locking protrusions 216 (see FIG. 12) of the main body 210, whereby the stopper body 220 is assembled to a lower end of the main body 210.

Figure 15:
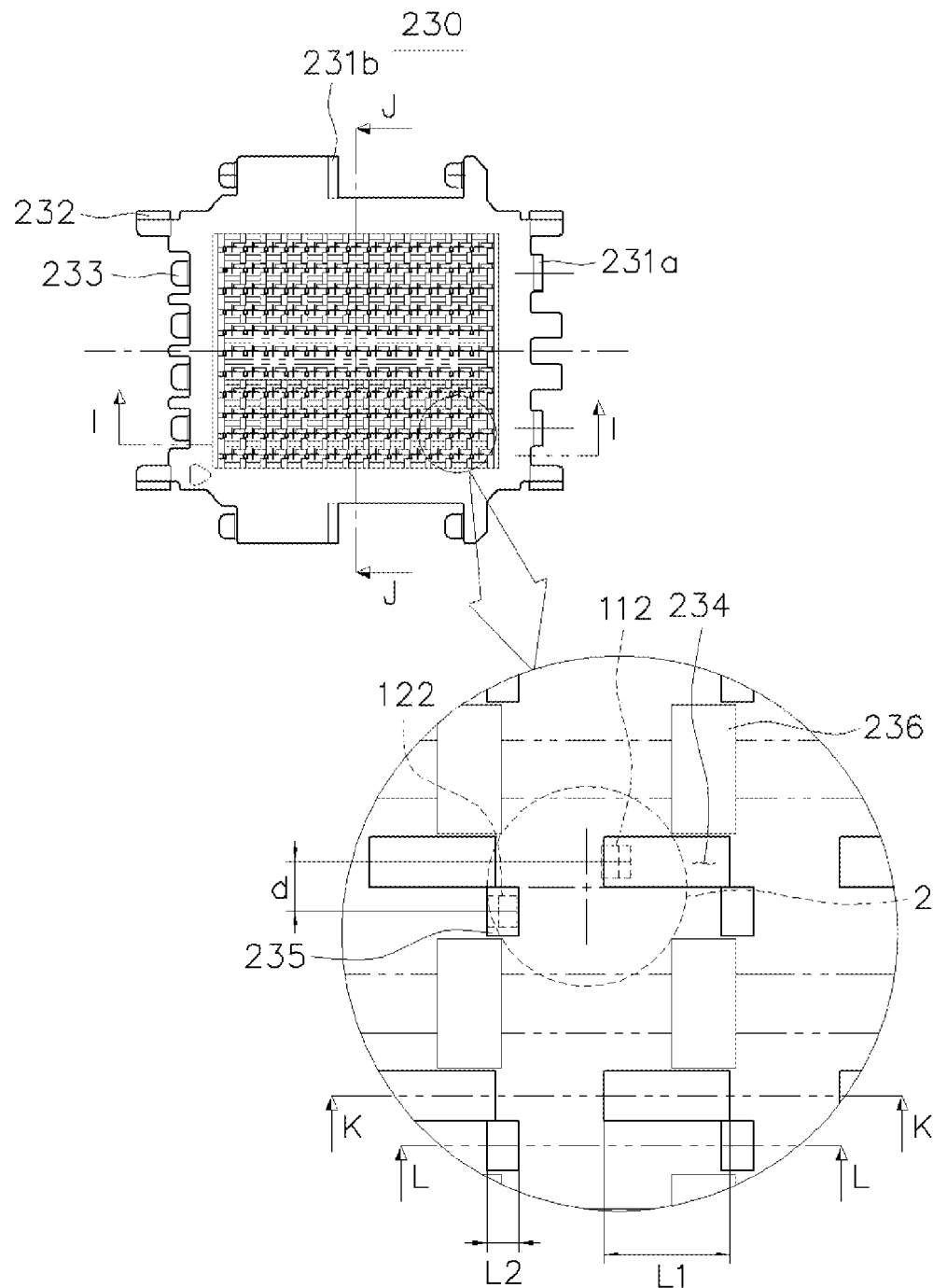
FIG. 15 is a plan view illustrating a slider according to an embodiment of the present disclosure.
Figure 16A:
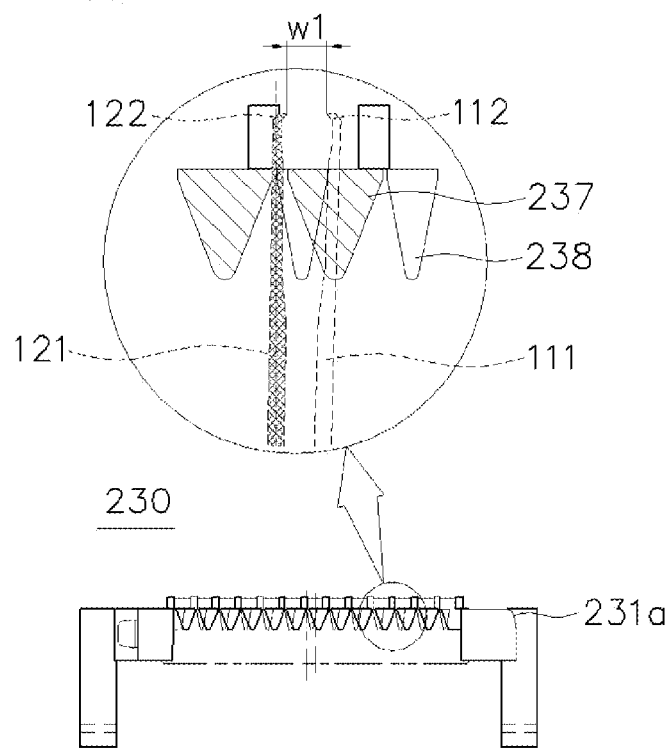
FIGS. 16(a) and 16(b) are cross-sectional views taken along line I-I and line J-J in FIG. 15, respectively.
Figure 16B:
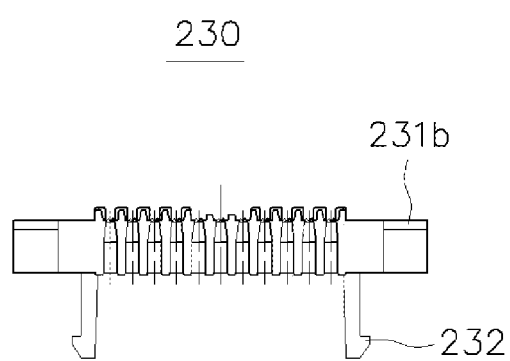
Figure 17A:
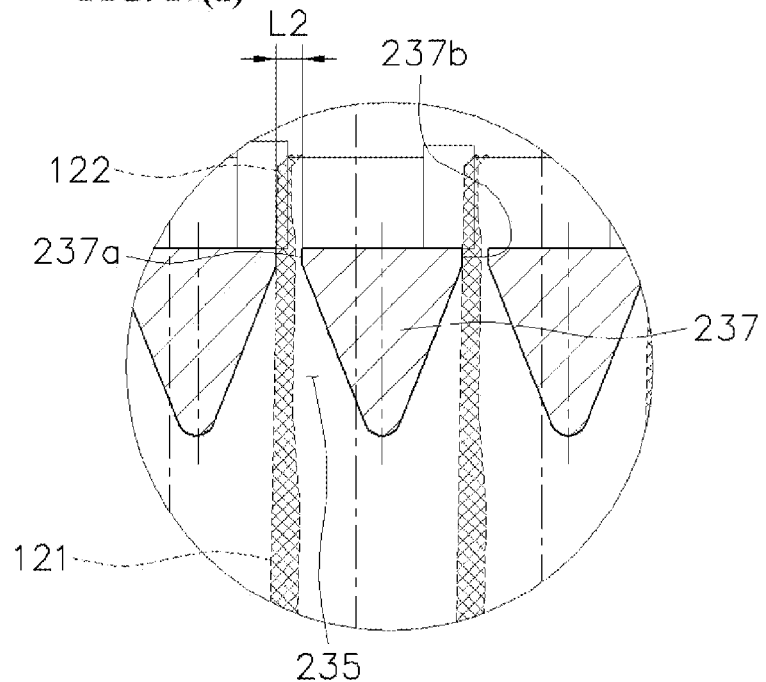
FIGS. 17(a) and 17(b) are cross-sectional views taken along line K-K and line L-L in FIG. 15.
Figure 17B:
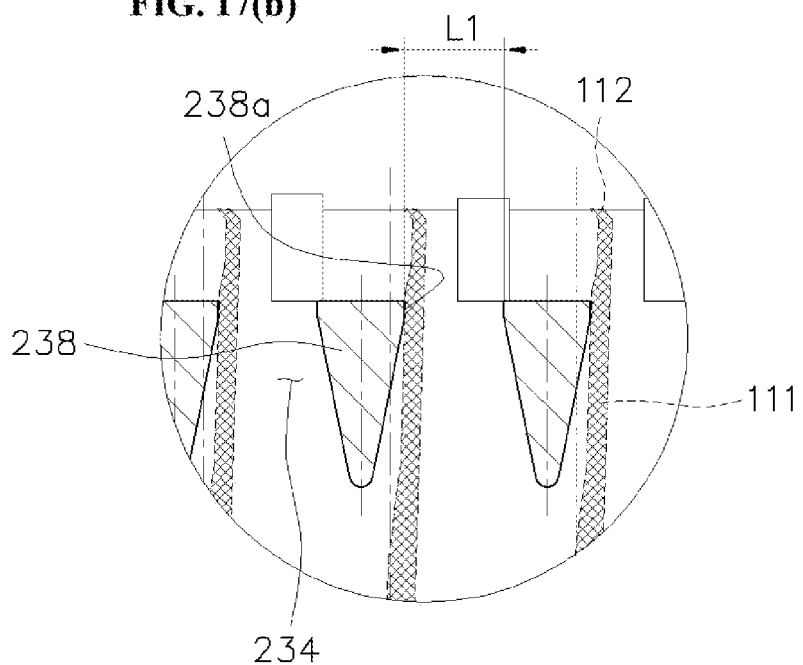

FIG. 15 is a plan view illustrating a slider according to an embodiment of the present disclosure, FIGS. 16(a) and 16(b) are cross-sectional views taken along line I-I and line J-J in FIG. 15, respectively, and FIGS. 17(a) and 17(b) are cross-sectional views taken along line K-K and line L-L in FIG. 15.

Referring to FIGS. 15 to 17, the slider 230 includes multiple cam contact portions 231a and 231b, and the main body 210 and the slider 230 are elastically supported by the contact force generating springs 241. The respective cam contact portions 231a and 231b are exposed outside the upper surface of the main body 210 through the holes of the main body in a state in which the assembled main body 210 and slider 230 are elastically supported by the contact force generating springs 241.

Each of the cam contact portions 231a and 231b integrally protrudes from each side of the slider 230 to have a predetermined curved shape at the upper end edge of the slider. When the cam contact portions 231a and 231b are pressed by slider actuating cams 313 of the IC loading/unloading device (see FIG. 7), horizontal operation of the slider 230 is performed.

Reference numeral 232 denotes a locking hook, which is fitted to each hook locking step of the main body to guide horizontal movement of the slider 230 in a sliding direction. Reference numeral 233 denotes a spring locking guide to which each of the contact force generating springs 241 (see FIG. 6) is locked.

The slider 230 includes a fixed terminal receiving hole 234 and a movable terminal receiving hole 235 in which the pins of each of the contacts 100 are received, respectively, by passing therethrough. It is preferable that the fixed terminal receiving hole 234 and the movable terminal receiving hole 235 are offset from each other by a predetermined distance d, and a length L1 of the fixed terminal receiving hole 234 is longer than a length L2 of the movable terminal receiving hole 235 (L1>L2).

The slider 230 includes a solder ball guide 236 provided on an upper surface thereof and guiding a seat position of the solder ball 2 in the process of loading the IC. In the present embodiment, the solder ball guide 236 is provided as multiple blocks arranged equidistantly from a seat center of the solder ball 2, but is not limited thereto.

It is preferable that an opening/closing movable piece 237 protruding in an inverted triangular shape in cross-section is provided between neighboring movable terminal receiving holes 235. The opening/closing movable piece 237 having an inverted triangular shape in cross-section is configured such that left and right ends thereof function as an opening pressure end 237a and a closing pressure end 237b, respectively, with respect to two neighboring pins 121.

Furthermore, a distance maintaining movable piece 238 protruding in an inverted triangular shape in cross-section is provided between neighboring fixed terminal receiving holes 234. The distance maintaining movable piece 238 includes an end portion 238a supporting an inner surface of the pin 111 so as to maintain a minimum distance between the upper tips 112 and 122.

Figure 18:
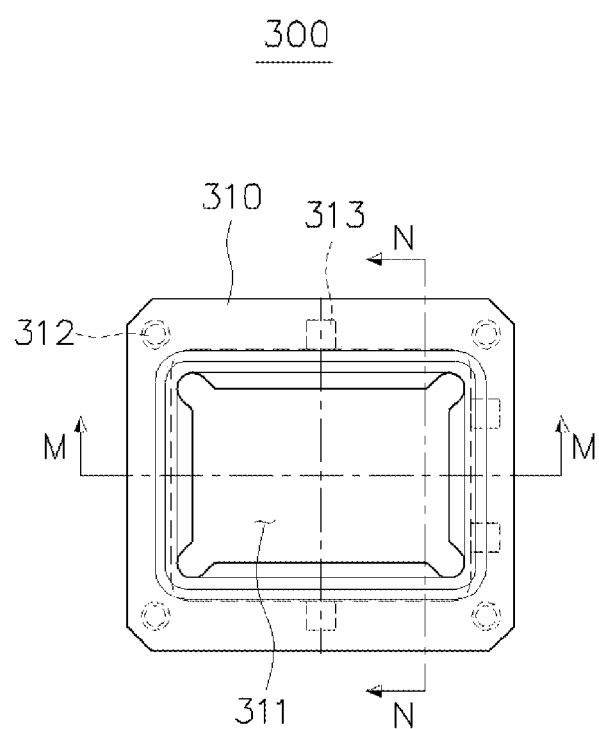
FIG. 18 is a plan view of an IC loading/unloading device according to an embodiment of the present disclosure.
Figure 19A:
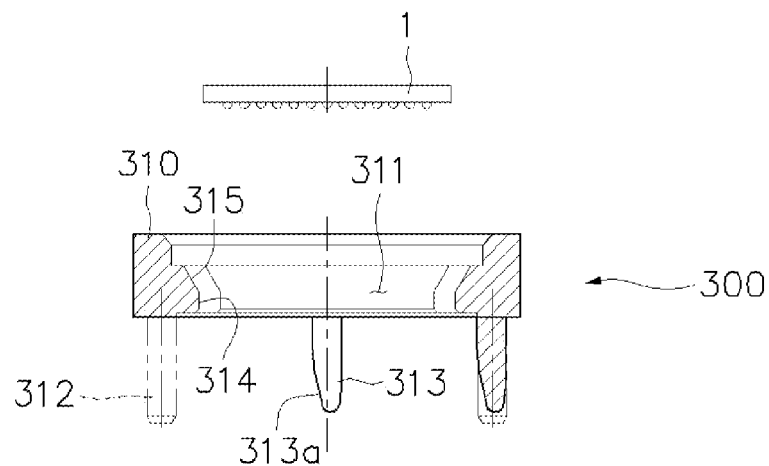
FIGS. 19(a) and 19(b) are cross-sectional views taken along line M-M and line N-N in FIG. 18, respectively.
Figure 19B:
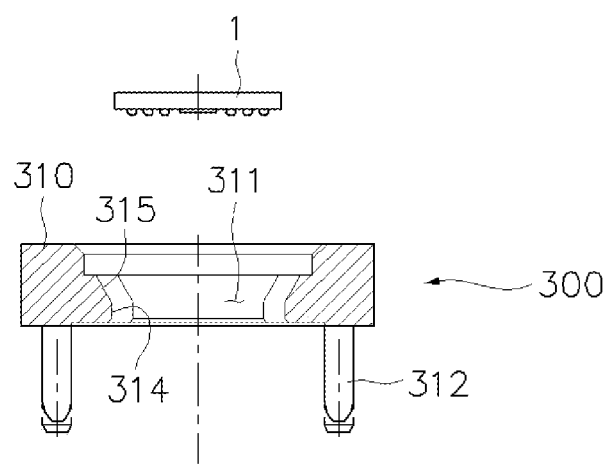

FIG. 18 is a plan view of an IC loading/unloading device according to an embodiment of the present disclosure, and FIGS. 19(a) and 19(b) are cross-sectional views taken along line M-M and line N-N in FIG. 18, respectively.

Referring to FIGS. 18 and 19, an IC loading/unloading device 300 is detachably assembled to the upper portion of the main body 210 by fitting during loading/unloading of the IC while pressing the cam contact portions of the slider 230 to provide an operating force for horizontal operation of the slider 230. Meanwhile, in the present disclosure, assembling between the IC loading/unloading device 300 and the main body 210 is performed in such a manner that the IC loading/unloading device 300 is assembled to the upper portion of the main body 210 in a male and female engagement, and assembling therebetween is performed within the range where they are easily detached from each other. Therefore, it is to be understood that an assembly structure in which the IC loading/unloading device is integrally provided with the main body and thus is impossible to separate therefrom, and an assembly structure in which the IC loading/unloading device is firmly locked to the main body by a fastening means such as a bolt and thus is difficult to separate therefrom are not considered.

In detail, the IC loading/unloading device 300 includes: a body portion 310 having a substantially quadrangular-shaped receiving hole 311 corresponding to an IC seat portion of the main body; and a slider actuating cam 313 extending from a lower end of the body portion 310. The IC loading/unloading device 300 may further include a guide arm 312 protruding from the lower end of the body portion 310.

The body portion 310 includes a guide inner surface 314 defining a lower open end of the receiving hole 311, and an IC guide inclined surface 315 inclinedly extending from the guide inner surface 314. This configuration allows the IC 1 to be loaded along the IC guide inclined surface 315 to be placed inside the guide inner surface 314, thus being correctly seated on the IC seat portion of the main body 210.

The guide arm 312 is provided at a location corresponding to each of the guide holes 211 of the main body 210 to guide an assembly position of the IC loading/unloading device during assembly with the main body 210.

The slider actuating cam 313 is provided at a location corresponding to each of the holes 212 of the main body 210 to press each of the cam contact portions 231 of the slider 230 during assembly of the IC loading/unloading device with the main body 210. In FIG. 18, four slider actuating cams 313 are provided corresponding to the holes of the main body 30 at upper and lower symmetrical locations, but the locations and numbers thereof may vary.

It is preferable that each of the slider actuating cams 313 includes a lower end portion 313a having a wedge shape with a curved or inclined surface. This configuration allows that when the slider actuating cams 313 come in to contact with the curved-shaped cam contact portions 231 of the slider 230, a vertical operating force of the slider actuating cams 313 is converted into a horizontal operating force of the slider 230.

The IC loading/unloading device 300 is allowed to be assembled to the main body 210 in a male and female engagement only during loading/unloading of the IC. Accordingly, testing of the IC is performed in a state in which the IC loading/unloading device 300 is detached from the main body 210.

Figure 20:
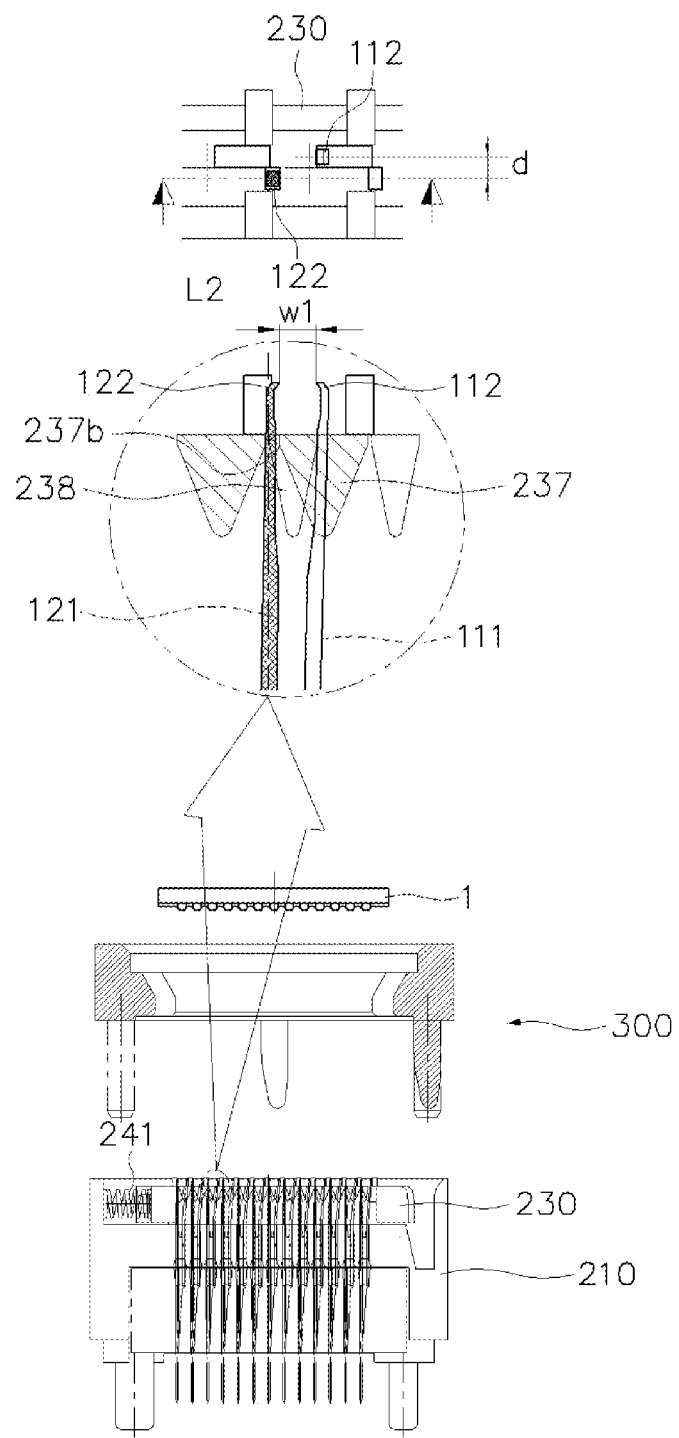
FIGS. 20 to 22 are views illustrating a contact process between a solder ball of an IC and a contact in the lidless socket device according to the first embodiment of the present disclosure.
Figure 21:
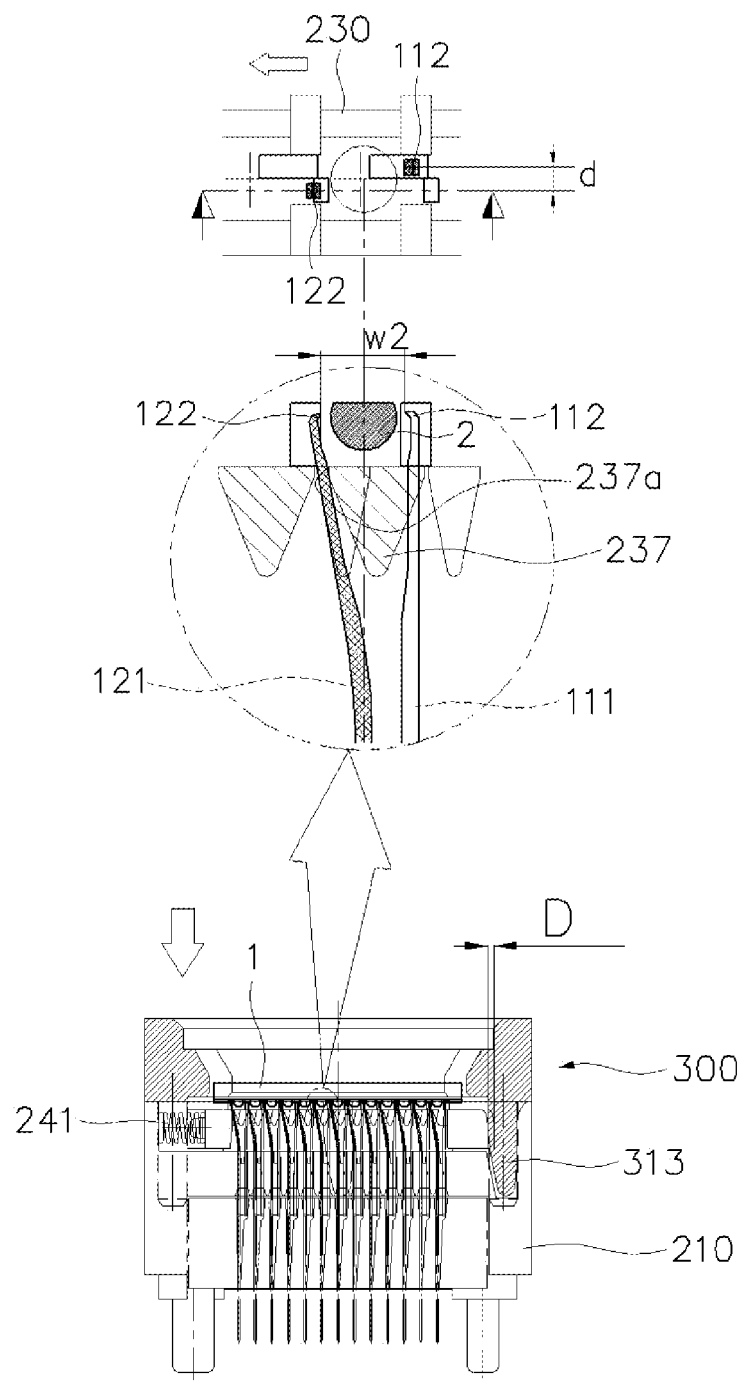
Figure 22:
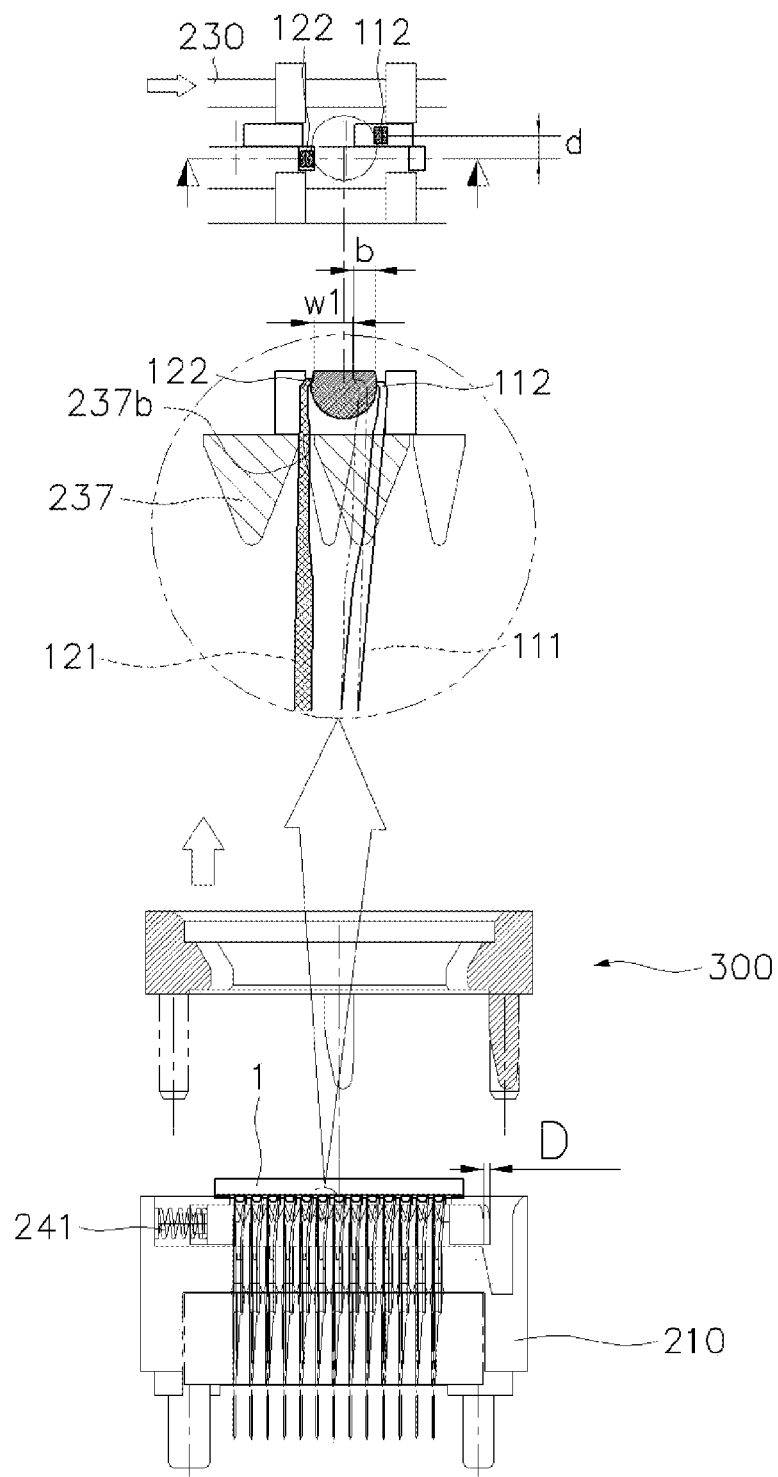

FIGS. 20 to 22 are views briefly illustrating a contact process between a solder ball of an IC and a contact in the socket device according to the first embodiment of the present disclosure.

FIG. 20 illustrates an initial state of the socket device, in which the IC loading/unloading device 300 is detached from the main body 210, which is the step before loading the IC 1. The slider 230 is in a state of being elastically supported by the contact force generating springs 241 to be bias pressed rightward.

Meanwhile, each of the contacts 100 is in a state in which the pin 111 is supported in contact with the distance maintaining movable piece 248 while the contact body 130 is fixed in the main body 210, and the pin 121 is supported in contact with the closing pressure end 249b of the opening/closing movable piece 237. Herein, an initial distance w1 between the upper tips 112 and 122 is smaller than the diameter of the solder ball 2.

Next, as shown in FIG. 21, when the IC loading/unloading device 300 is assembled to the upper portion of the main body 210 by fitting, the slider actuating cams 313 are inserted into the holes 212 (see FIG. 7) of the main body 210 to push the cam contact portions, causing the slider 230 to be moved leftward. At this time, the slider 230 is horizontally moved leftward by a predetermined displacement D while compressing the contact force generating springs 241.

The opening/closing movable piece 237 is also horizontally moved in cooperation with horizontal movement of the slider 230, causing the pin 121 to be pushed. At this time, the opening pressure end 237a of the opening/closing movable piece 237 pushes the pin 121, causing the upper tips 112 and 122 to be opened such that a distance w2 therebetween is equal to or greater than the diameter of the solder ball 2. Then, the IC 1 is loaded onto the socket device and the solder ball 2 is located between the upper tips 112 and 122.

Referring to FIG. 22, when the IC loading/unloading device 300 is detached from the main body 210 after the IC 1 is loaded onto the socket device, the slider is returned to an original position thereof by an elastic restoring force of the contact force generating springs 241.

Meanwhile, in the process of returning the slider 230, the pin 121 comes into contact with the solder ball 2 in a state of being pressed by the closing pressure end 237b of the opening/closing movable piece 237. Herein, since the initial distance w1 between the upper tips 112 and 122 is designed to be smaller than the diameter of the solder ball 2 (see FIG. 20), the upper tip 112 comes into contact with the solder ball 2 with a contact force due to displacement equal to a distance difference b with respect to the initial state.

Thereafter, the IC 1 loaded onto the socket device is subjected to testing, with absence of the IC loading/unloading device 300. When testing of the IC 1 is completed, unloading of the IC 1 is performed by using the IC loading/unloading device 300 in the same manner described above.

FIGS. 23(a) and 23(b) are a front view and a side view, respectively, illustrating a dual pinch type contact according to another embodiment of the present disclosure.

Referring to FIGS. 23(a) and 23(b), a contact 400 of the present embodiment is a dual pinch type contact, including a fixed terminal 410 and a movable terminal 420. The contact 400 includes a contact body 430 to which lower ends of the fixed and movable terminals 410 and 420 are integrally fixed, and a lead 140 extending downward from the contact body 430.

The fixed terminal 410 includes a pin 411, and an upper tip 412 provided at an upper end of the fixed pin 411 and coming into direct contact with a solder ball 2. The movable terminal 420 also includes a pin 421, and an upper tip 422 provided at an upper end of the movable pin 421.

The fixed upper tip 412 and the movable upper tip 422 are offset from each other by a predetermined distance d with respect to the center of the solder ball 2.

Particularly, in the present embodiment, the lead 240 has a curved portion. Due to the curved portion of the lead 440, the lead 440 has a predetermined elastic force exerted in an upward-and-downward direction and comes into contact with a contact pad of the PCB while being compressed, thus increasing a contact force.

Second Embodiment

Figure 24:
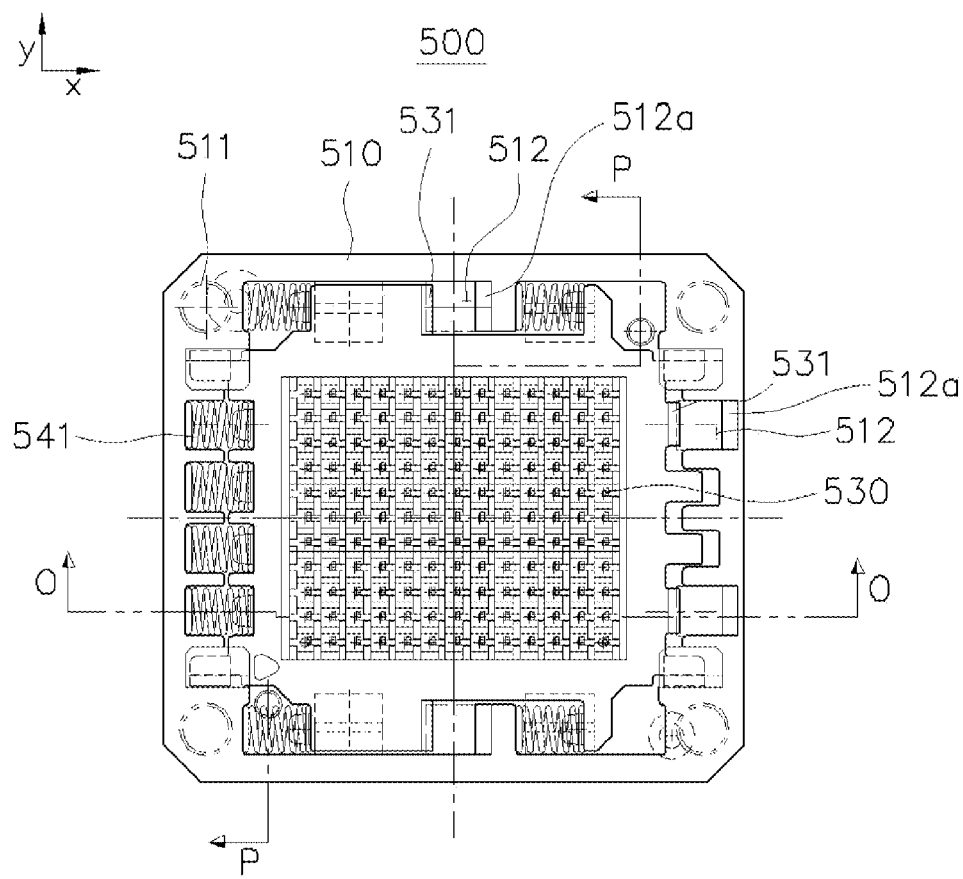
FIG. 24 is a plan view illustrating a lidless BGA socket device according to a second embodiment of the present disclosure.
Figure 25:
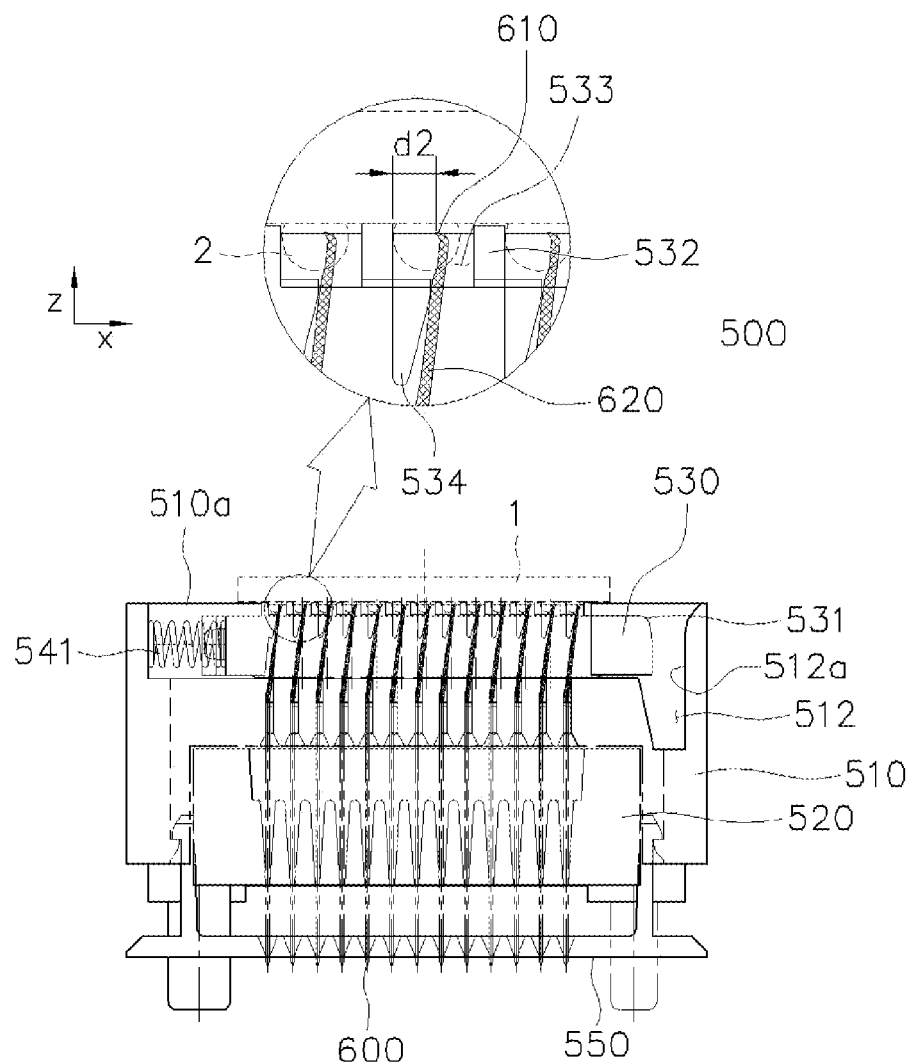
FIG. 25 is a cross-sectional view taken along line O-O in FIG. 24.
Figure 26:
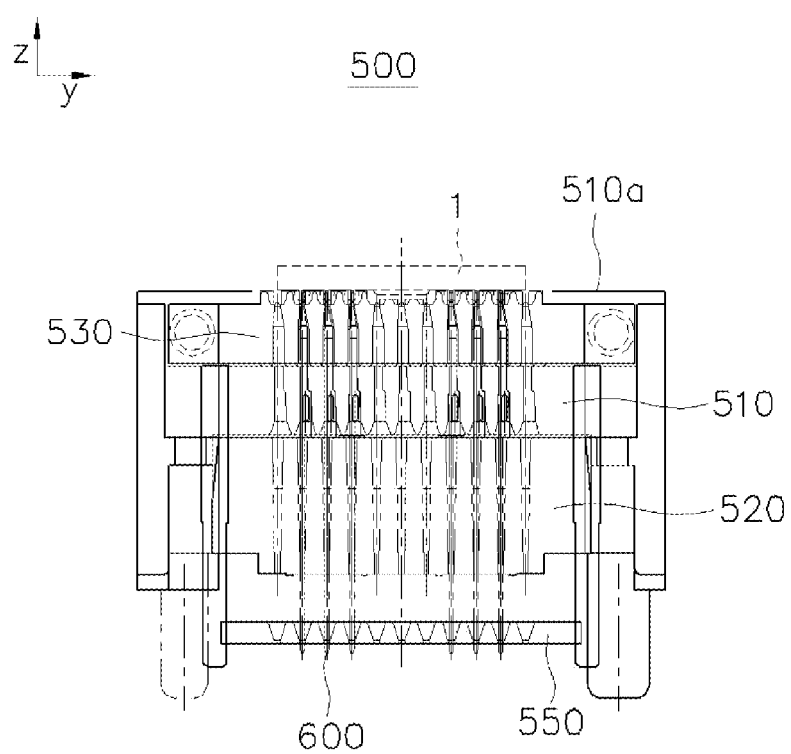
FIG. 26 is a cross-sectional view taken along line P-P in FIG. 24.

FIG. 24 is a plan view illustrating a lidless BGA socket device according to a second embodiment of the present disclosure, FIG. 25 is a cross-sectional view taken along line O-O in FIG. 24, and FIG. 26 is a cross-sectional view taken along line P-P in FIG. 24. In the present embodiment, a contact is a single pin type contact, and the fact that an IC loading/unloading device of a socket device can be detachably assembled to a main body and assembling therebetween is only allowed during IC loading/unloading is the same as the first embodiment. Therefore, an overlapping description will be omitted and only differences will be described.

Referring to FIGS. 24 and 26, a socket device 500 according to a second embodiment includes a contact 600 including an upper tip 610 and having an elastic force exerted in a lateral direction, the contact coming into electrical contact with each solder ball 2 of an IC 1; a main body 510 including a slider receiving portion depressed in an horizontal upper surface 510a, and a cam supporting portion 512a formed in the upper surface 510a at a location corresponding to a peripheral portion of the slider receiving portion to define an end inner surface, the main body being configured such that contacts 600 are fixed to a lower surface of the slider receiving portion; a slider 530 enabling forward and backward sliding in a horizontal direction in the slider receiving portion provided in an upper portion of the main body 510, and including a cam contact portion 531 provided at an end thereof while facing the cam supporting portion 512a such that the forward and backward sliding is performed in response to a lateral operating force applied to the cam contact portion 531, the slider transmitting the lateral operating force to the contacts 600 in accordance with forward and backward sliding positions thereof to allow solder balls 2 of the IC 1 and the contacts 600 to come into contact with each other; and a contact force generating spring 541 provided between the main body 510 and the slider 530, and elastically supporting the slider 530 in a moving direction (x-axis direction) to provide a contact force between the contacts 600 and the solder balls 2 of the IC 1.

The socket device may further include a stopper body 520 provided at a lower end of the main body 510 for fixing the contacts 600, and a lead guide 550 for guiding leads of the contacts 600.

Figure 27A:
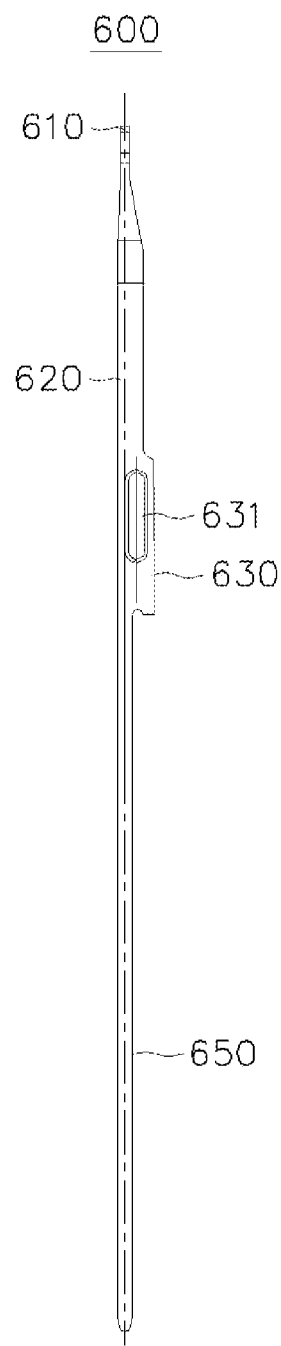
FIGS. 27(a) and 27(b) are a front view and a side view, respectively, illustrating a single pin type contact in the second embodiment of the present disclosure.
Figure 27B:
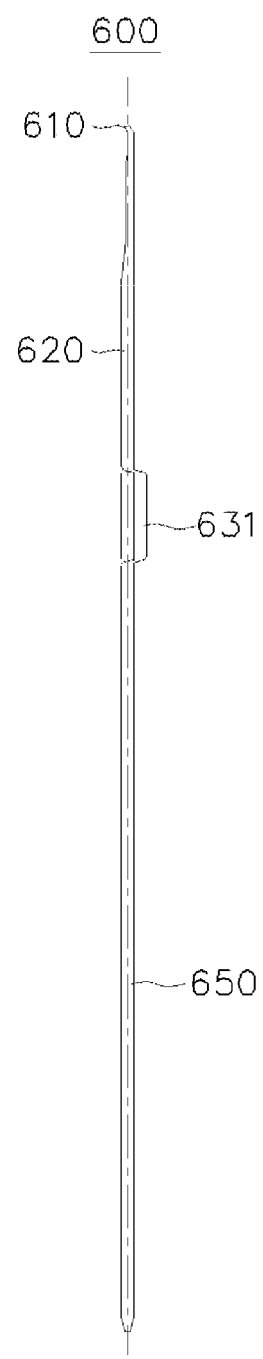

Referring to FIGS. 27(a) and 27(b), each of the contacts 600 of the present embodiment is a single pinch type contact, including a terminal 620 having a predetermined elastic force and including the upper tip 610 coming into contact with the solder ball of the IC, a contact body 630 integrally fixed to a lower end of the terminal 620, and a lead 640 extending downward from the contact body 430. The lead 640 is assembled to a through hole of a PCB (not shown) and fixed by soldering.

The contact body 640 may include a support protrusion 631. The support protrusion 631 functions to support the contact 600 in the horizontal direction when located in a receiving hole of the main body by being supported on an inner surface thereof.

Referring to FIG. 25, the slider 430 includes multiple solder ball guides 532 arranged on an upper surface thereof at a predetermined interval and guiding a seat position of the solder balls 2 in the process of loading the IC, and multiple terminal receiving holes 533 are provided between the solder ball guides 532 such that the terminal 620 of each of the contacts is located in each of the terminal receiving holes 533.

It is preferable that an opening/closing movable piece 534 protruding in an inverted triangular shape in cross-section is provided between neighboring terminal receiving holes 533. A right end of the opening/closing movable piece 534 supports the terminal 620 of each of the contacts so as to maintain a minimum distance d2 between each of the solder ball guides 532 and the upper tip 610 of the contact. It is preferable that the minimum distance d2 is smaller than the diameter of the solder ball 2.

In the socket device of the second embodiment configured as described above, the IC loading/unloading device is allowed to be assembled to the main body only during loading/unloading of the IC, and after loading or unloading the IC, the IC loading/unloading device is detached from the main body, whereby testing of the IC is performed. Since a configuration of the IC loading/unloading device is the same as that of the first embodiment, a description thereof will be omitted. In the following description, the reference numeral of the IC loading/unloading device is the same as that of the first embodiment.

Figure 28C:
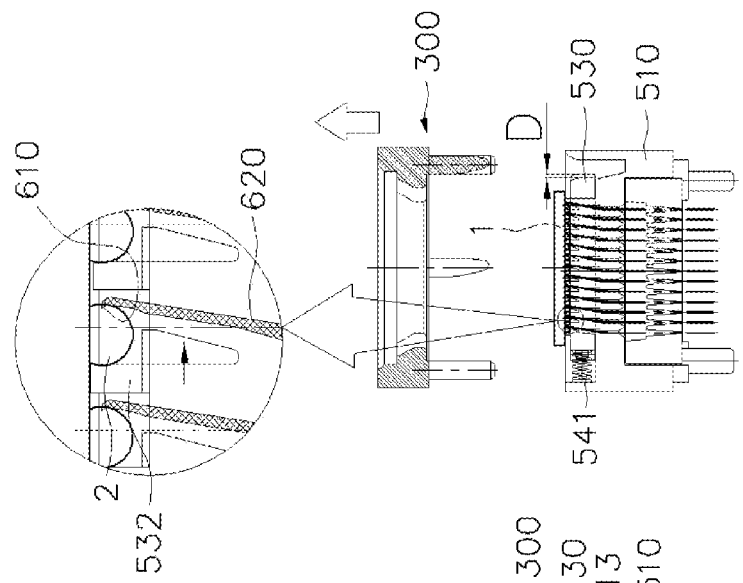
FIGS. 28(a), 28(b), and 28(c) are views illustrating a contact process of a solder ball of an IC and a contact in the lidless BGA socket device according to the second embodiment of the present disclosure.
Figure 28B:
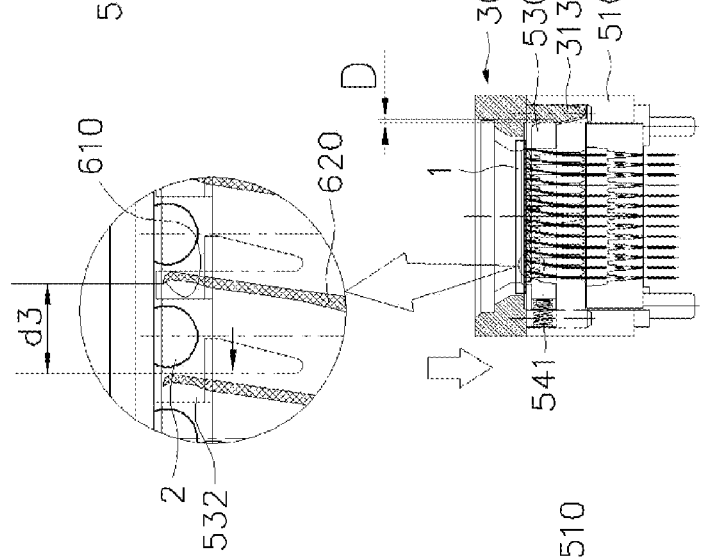
Figure 28A:
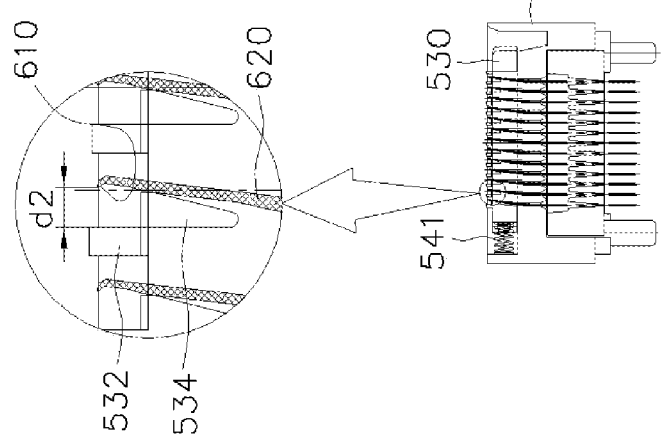

FIGS. 28(a), 28(b), and 28(c) are views illustrating a contact process of a solder ball of an IC and a contact in the lidless BGA socket device according to the second embodiment of the present disclosure.

FIG. 28(a) illustrates an initial state of the socket device, in which the IC loading/unloading device is detached from the main body 510, which is the step before loading the IC. The slider 530 is in a state of being elastically supported by contact force generating springs 541 to be bias pressed rightward. Meanwhile, the right ends of the opening/closing movable pieces 534 support the terminals 620 of the contacts so as to maintain the minimum distance d2 between each of the solder ball guides 532 and the upper tip 610 of each of the contacts. Herein, the minimum distance d2 is smaller than each of the solder balls.

Next, referring to FIG. 28(b), when the IC loading/unloading device 300 is assembled to the upper portion of the main body 510 by fitting, the slider actuating cams 313 are inserted into holes 512 of the main body 510 to push the cam contact portions, causing the slider 530 to be moved leftward. At this time, the slider 530 is horizontally moved leftward by a predetermined displacement D while compressing the contact force generating springs 541.

When the slider 530 is moved leftward, the solder ball guides 532 are moved theretogether, causing the upper tips 610 of the terminals 620 of the contacts to be opened. In this state, the solder balls 2 of the IC 1 are allowed to be seated in the upper surface of the slider 530. Herein, a distance d3 between each of the solder ball guides 532 and the upper tip 610 of each of the contacts is larger than the diameter of each of the solder balls 2.

Referring to FIG. 28(c), when the IC loading/unloading device 300 is detached from the main body 510 after the IC 1 is loaded onto the socket device, the slider 530 is returned to an original position thereof by a compressive force of the contact force generating springs 541 by a predetermined distance D, causing the solder ball guides 532 to push the solder balls 2 rightward, whereby the solder balls 2 come into contact with the upper tips 610 by an appropriate contact force.

Third Embodiment

Figure 29:
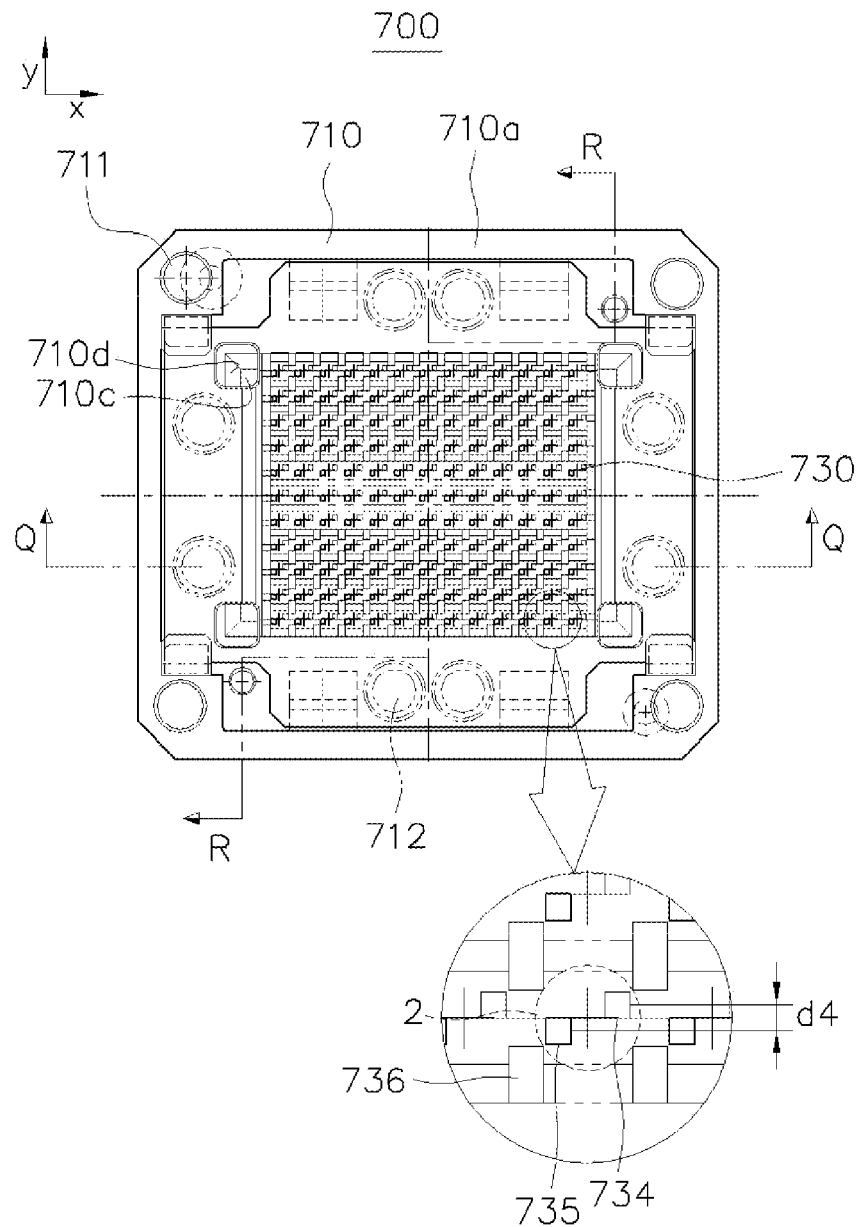
FIG. 29 is a plan view illustrating a lidless BGA socket device according to a third embodiment of the present disclosure.
Figure 30:
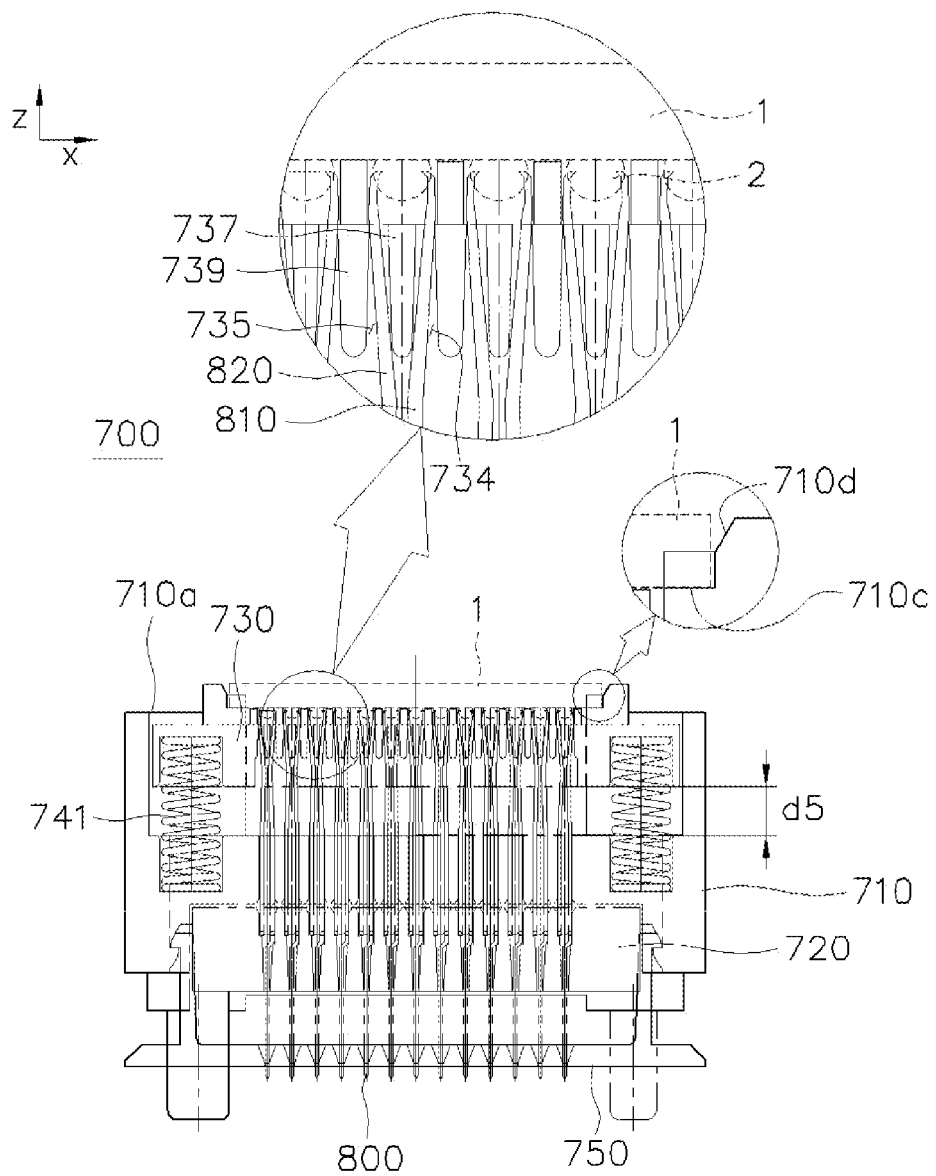
FIG. 30 is a cross-sectional view taken along line Q-Q in FIG. 29.
Figure 31:
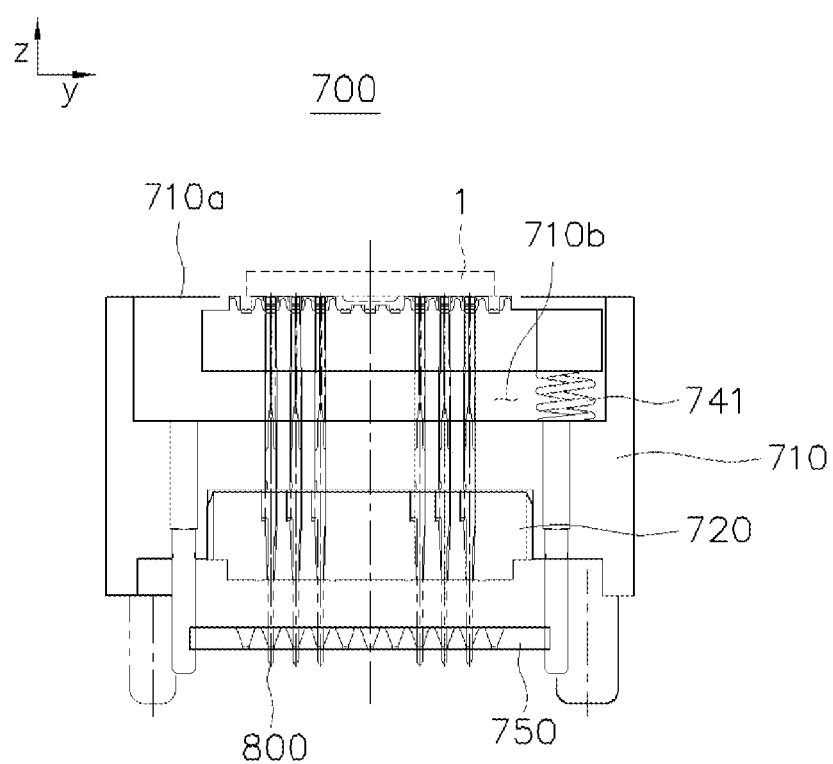
FIG. 31 is a cross-sectional view taken along line R-R in FIG. 29.

FIG. 29 is a plan view illustrating a lidless BGA socket device according to a third embodiment of the present disclosure, FIG. 30 is a cross-sectional view taken along line Q-Q in FIG. 29, and FIG. 31 is a cross-sectional view taken along line R-R in FIG. 29. In the present embodiment, a contact is a symmetric dual pinch type contact, and the fact that an IC loading/unloading device of a socket device can be detachably assembled to a main body and assembling therebetween is only allowed during IC loading/unloading is the same as the foregoing embodiments. Therefore, an overlapping description will be omitted and only differences will be described.

Referring to FIGS. 29 to 31, a socket device 700 according to the present embodiment includes a contact 800 including an upper tip and having an elastic force exerted in a lateral direction, the contact coming into electrical contact with each solder ball 2 of an IC 1; a main body 710 including an IC seat portion 710c provided on a horizontal upper surface 710a and allowing the IC to be seated thereon, and a slider receiving portion 710b depressed in the upper surface 710a, the main body being configured such that contacts 800 are fixed to a lower surface of the slider receiving portion 710b; a slider 730 received in the slider receiving portion 710b so as to be slidable upward and downward and enabling upward and downward sliding in response to a vertical operating force applied to the slider in a vertical direction (z-axis direction), the slider transmitting a lateral operating force to the contacts 800 in accordance with upward and downward sliding positions thereof to allow solder balls 2 of the IC 1 and the contacts 800 to come into contact with each other; and a contact force generating spring 741 provided between the main body 710 and the slider 730, and elastically supporting the slider 730 in a moving direction (z-axis direction) to provide a contact force between the contacts 800 and the solder balls 2 of the IC 1.

The socket device may further include a stopper body 720 provided at a lower end of the main body 710 for fixing the contacts 800, and a lead guide 750 for guiding leads of the contacts 800.

The main body 710 includes multiple guide holes 711 at locations adjacent to IC seat portions 710c. The guide holes 711 guide an assembly position of an IC loading/unloading device.

The main body 710 includes the upper surface 710a having a horizontally flat surface structure, and the IC seat portions 710c allowing a lower edge of the IC 1 to be seated thereon. In detail, the IC seat portions 710c extend vertically from the main body 710 and pass through the slider 730 to protrude outward of an upper surface of the slider 730. A portion of the lower edge of the IC 1 is allowed to be seated on the IC seat portions 710c, while the region of the solder balls 2 of the IC 1 faces the slider 730 received in the main body 710. In the present embodiment, four IC seat portions 710c are arranged at locations corresponding to respective corners of the IC. It is preferable that each of the IC seat portions 710c includes an inclined guide surface 710d, such that during loading of the IC 1, the IC 1 is allowed to be accurately seated on the IC seat portions 710c along the guide surfaces 710d.

The slider 730 includes a solder ball guide 736 provided on the upper surface thereof and guiding a seat position of the solder ball 2 in the process of loading the IC. In the present embodiment, the solder ball guide 736 is provided as multiple blocks arranged equidistantly from a seat center of the solder ball 2, but is not limited thereto.

The slider 730 includes first terminal receiving holes 734 and second terminal receiving holes 735 that are arranged at a regular interval. A first terminal 810 and a second terminal 820 of each of the contacts are inserted in each of the first terminal receiving holes 734 and each of the second terminal receiving holes 735, respectively. An opening movable piece 737 protruding in an inverted triangular shape in cross-section is provided between neighboring terminal receiving holes 734 and 735. The opening movable piece 737 is inserted between the first and second terminals 810 and 820 of each of the contacts to be in contact with an inner surface of each of the terminals 810 and 820. Meanwhile, a closing movable piece 739 protruding in an inverted triangular shape in cross-section is provided between neighboring contacts. The closing movable piece 739 is in contact with an outer surface of each of the terminals 810 and 820.

The slider 730 is assembled to an upper portion of the main body to have a gap of a predetermined height d5 such that the slider is movable upward and downward in the main body 710. The contact force generating spring 741 elastically supports the slider 730 upward.

In FIG. 29, reference numeral 712 denotes the position of a slider actuating pin that pushes the slider 230 downward when the IC loading/unloading device is seated on the upper surface of the main body. An operating force is generated by multiple slider actuating pins to be exerted downward toward the slider 230, such that the slider 230 is moved upward and downward while maintaining a horizontal state during an upward-and-downward movement of the slider 230. Furthermore, the slider 230 is elastically supported by multiple contact force generating springs 741 to provide a sufficient contact force between the contacts 800 and the solder balls of the IC. The locations and numbers of the slider actuating pins of the IC loading/unloading device and of the contact force generating springs may vary.

Figure 32A:
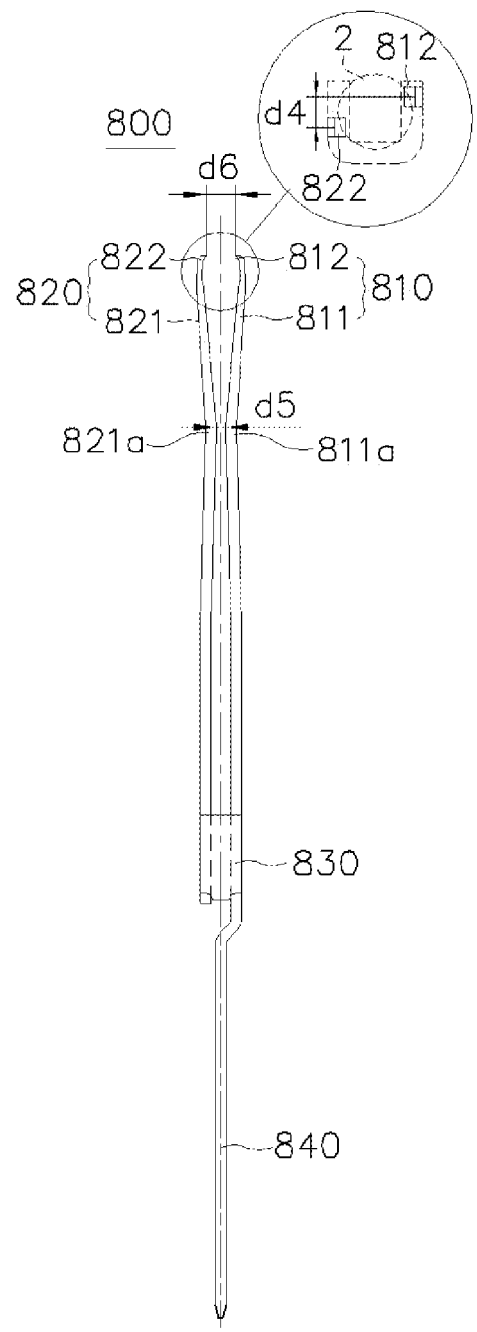
FIGS. 32(a) and 32(b) are a front view and a side view, respectively, illustrating a dual pinch type contact in the third embodiment of the present disclosure.
Figure 32B:
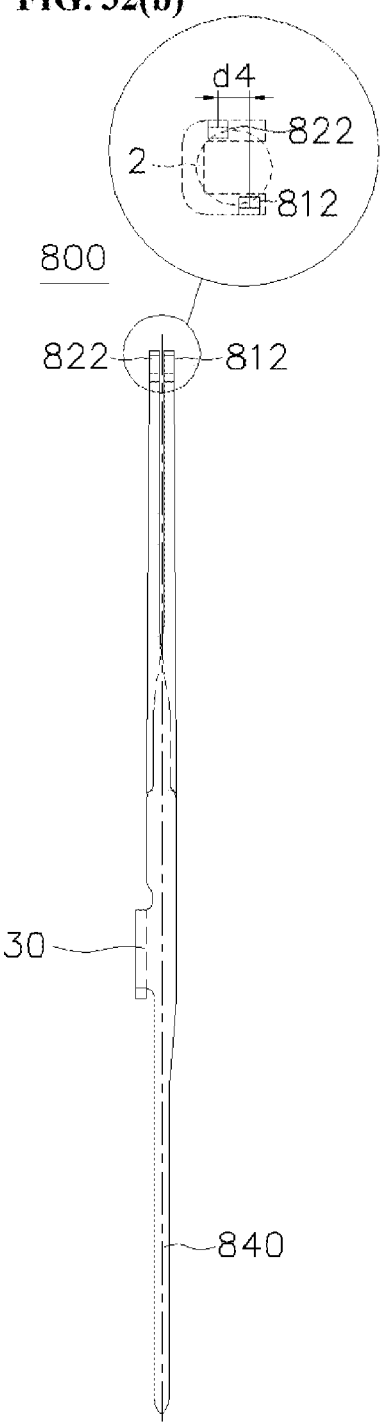

FIGS. 32(*a*) and 32(*b*) are a front view and a side view, respectively, illustrating a dual pinch type contact in the third embodiment of the present disclosure.

Referring to FIGS. 32(*a*) and 32(*b*), each of the contacts 800 of the present embodiment is a symmetric dual pinch type contact, including the first terminal 810 and the second terminal 820 bilaterally symmetrically provided to be offset from each other with the solder ball 2 of the IC 1 interposed therebetween. The contact 800 includes a contact body 830 to which lower ends of the first and second terminals 810 and 820 are integrally fixed, and a lead 840 extending downward from the contact body 830. The first terminal 810 and the second terminal 820 have an elastic force exerted in a lateral direction. The lead 840 is assembled to a through hole of a PCB (not shown) and fixed by soldering.

The first terminal 810 includes a first pin 811, and an upper tip 812 provided at an upper end of the first pin 811 and coming into direct contact with the solder ball 2. Similarly, the second terminal 820 includes a second pin 821, and an upper tip 822 provided at an upper end of the second pin 821.

The contact body 830 is supported on an inner surface of a receiving hole of the main body when located therein, such that the terminals 810 and 820 are elastically supported in horizontal directions.

It is preferable that the upper tip 812 of the first pin 811 and the upper tip 822 of the second pin 821 are offset from each other by a predetermined distance d4 with respect to the center of the solder ball 2. Therefore, in the present embodiment, each of the contacts 800 comes into contact with each solder ball 2 of the IC such that the upper tips 812 and 822 thereof are offset from each other by the predetermined distance d5 with respect to the solder ball 2.

The first pin 811 and the second pin 821 include bending points 811*a* and 821*a* provided at a predetermined height, respectively. A distance d5 between the bending points 811*a* and 821*a* is smaller than a distance d6 between the upper tips 812 and 822. Due to such a configuration, the first pin 811 and the second pin 821 have a shape in which upper portions are open outward with respect to the respective bending points 811*a* and 821*a*.

Figure 33A:
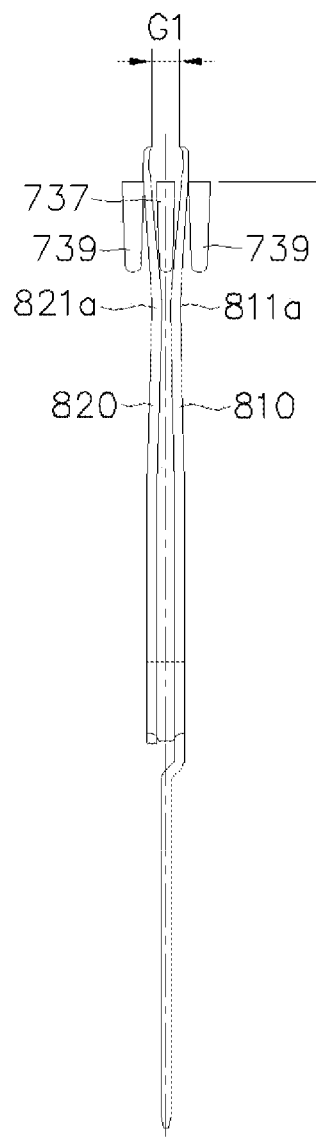
FIGS. 33(a), 33(b), and 33(c) are views illustrating opening and closing operations of a contact in accordance with heights of opening and closing movable pieces in the third embodiment of the present disclosure.
Figure 33B:
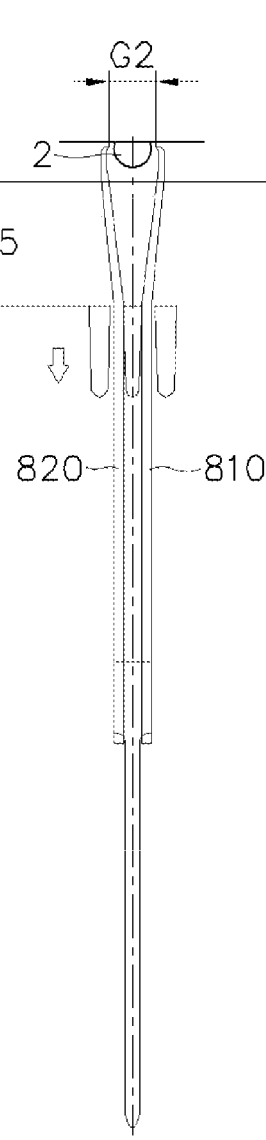
Figure 33C:
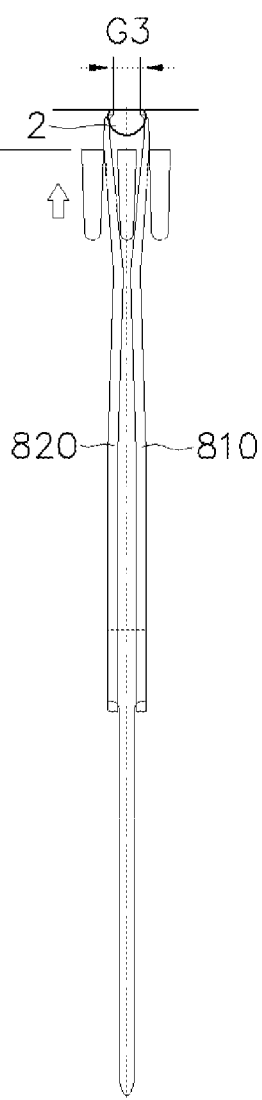

FIGS. 33(*a*), 33(*b*), and 33(*c*) are views illustrating opening and closing operations of a contact in accordance with heights of opening and closing movable pieces in the third embodiment of the present disclosure.

FIG. 33(*a*) illustrates an initial state of the socket device before loading the IC, in which the first terminal 810 and the second terminal 820 are in contact with neighboring closing movable pieces 739, respectively. Herein, a gap G1 between the upper tips 812 and 822 is smaller than the diameter of the solder ball 2.

Referring to FIG. 33(*b*), when the slider is moved downward, the movable piece 737 between the terminals 810 and 820 is moved downward while opening the terminals 810 and 820, and a gap G2 between the upper tips 812 and 822 at the lowermost position becomes greater than the diameter of the solder ball 2.

As shown in FIG. 33(*c*), when the slider is moved upward in a state in which the solder ball 2 is located between the upper tips 812 and 822, the terminals 810 and 820 are closed inward by the neighboring closing movable pieces 739, whereby the solder ball 2 comes into contact with the upper tips 812 and 822 by an appropriate contact force.

Figure 34:
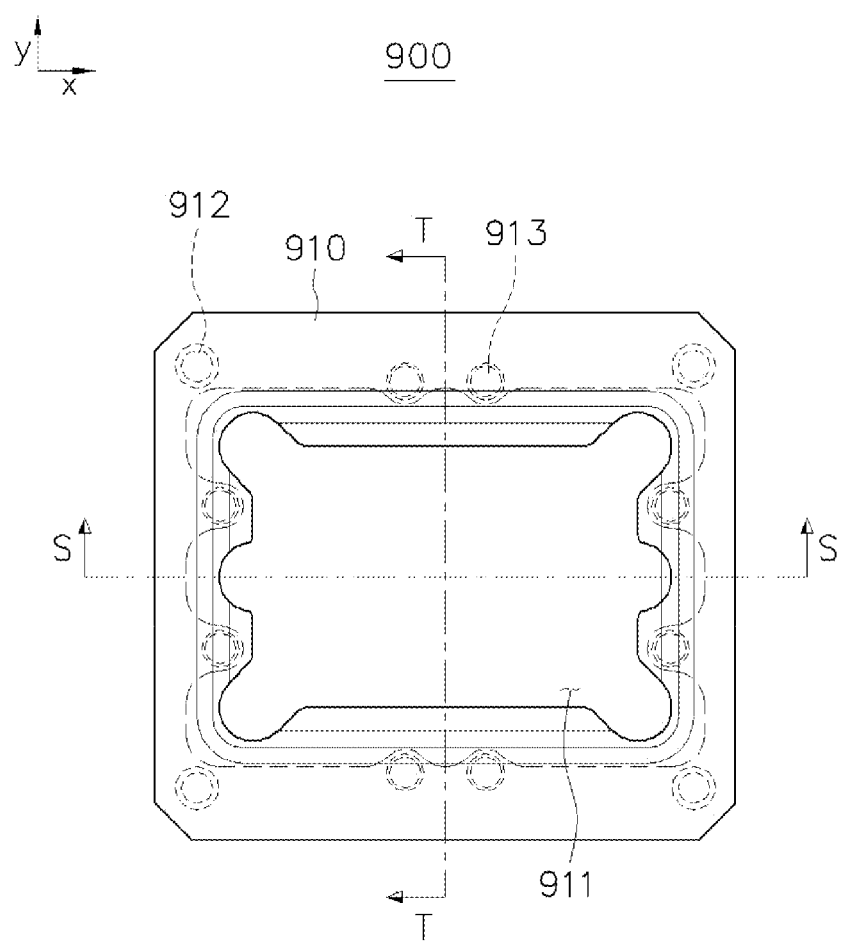
FIG. 34 is a plan view illustrating an IC loading/unloading device in the third embodiment of the present disclosure.
Figure 35A:
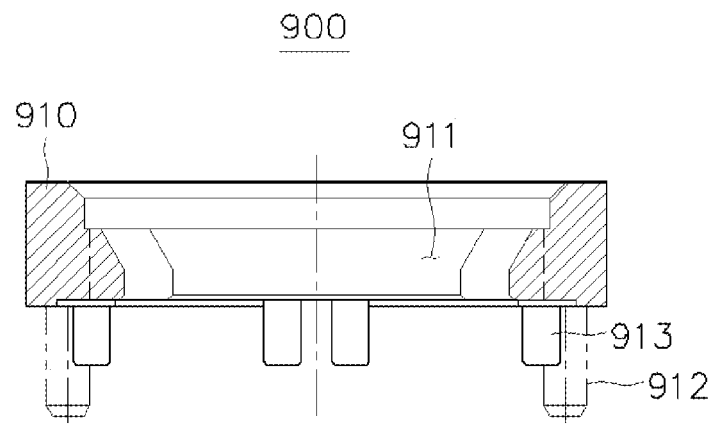
FIGS. 35(a) and 35(b) are cross-sectional views taken along line S-S and line T-T in FIG. 34, respectively.
Figure 35B:
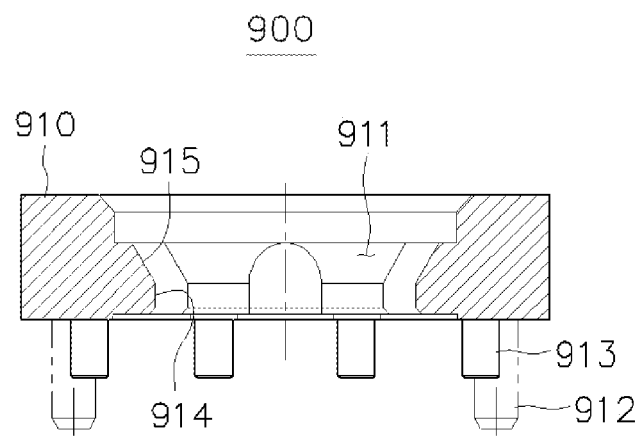

FIG. 34 is a plan view illustrating an IC loading/unloading device in the third embodiment of the present disclosure, and FIGS. 35(*a*) and 35(*b*) are cross-sectional views taken along line S-S and line T-T in FIG. 34, respectively.

Referring to FIGS. 34 to 35, as in the same manner in the foregoing embodiments, an IC loading/unloading device 900 of the present embodiment is detachably assembled to the upper portion of the main body 710 by fitting during loading and unloading of the IC while pressing the slider 730 to provide an operating force for vertical operation of the slider 730.

In detail, the IC loading/unloading device 990 includes: a body portion 910 having an a substantially quadrangular-shaped receiving hole 911 corresponding to the IC seat portions of the main body; a guide arm 912 extending from a lower end of the body portion 910; and a slider actuating pin 913 extending from the lower end of the body portion 910.

The body portion 910 includes a guide inner surface 914 defining a lower open end of the receiving hole 911, and an IC guide inclined surface 915 inclinedly extending from the guide inner surface 914. This configuration allows the IC 1 to be loaded along the IC guide inclined surface 915 to be placed inside the guide inner surface 914, thus being correctly seated on the IC seat portions of the main body 710.

The guide arm 912 is provided at a location corresponding to each of the guide holes 711 of the main body 710 to guide an assembly position of the IC loading/unloading device during assembly with the main body 710.

The slider actuating pin 913 presses the slider 730 downward while coming into contact with the upper surface of the slider 730. The locations and numbers of the guide arm 912 and the slider actuating pin 913 may vary.

The IC loading/unloading device 900 is allowed to be assembled to the main body 710 by fitting only during loading/unloading of the IC. Accordingly, testing of the IC is performed in a state in which the IC loading/unloading device 900 is detached from the main body 710.

Figure 36C:
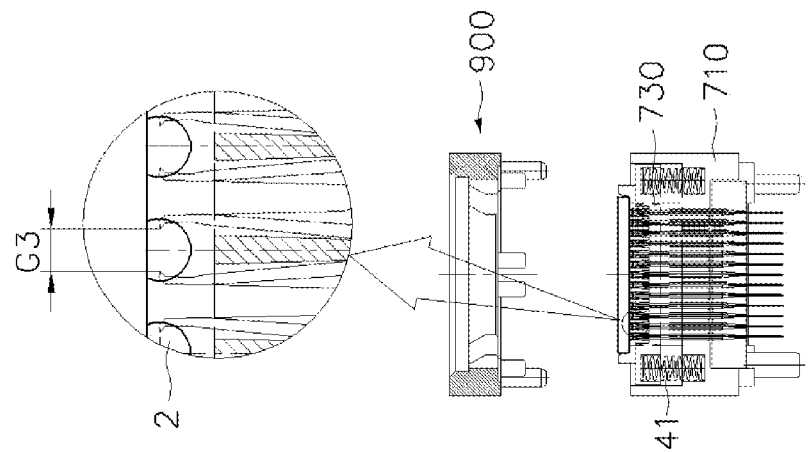
FIGS. 36(a), 36(b), and 36(c) are views illustrating a contact process of a solder ball of an IC and a contact in the lidless BGA socket device according to the third embodiment of the present disclosure.
Figure 36B:
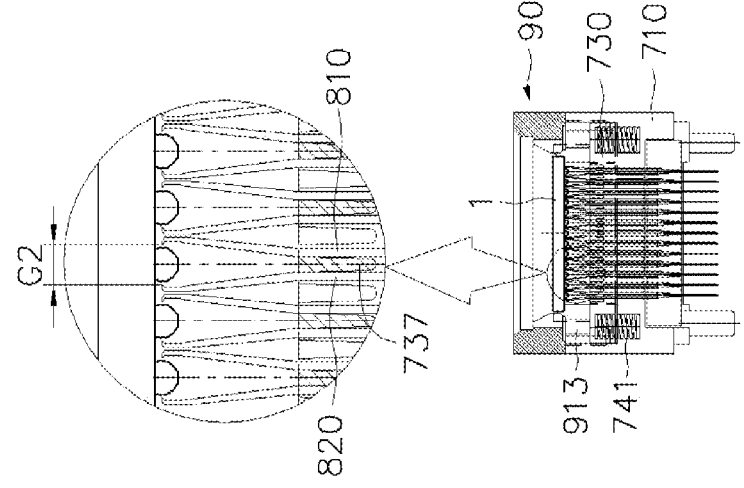
Figure 36A:
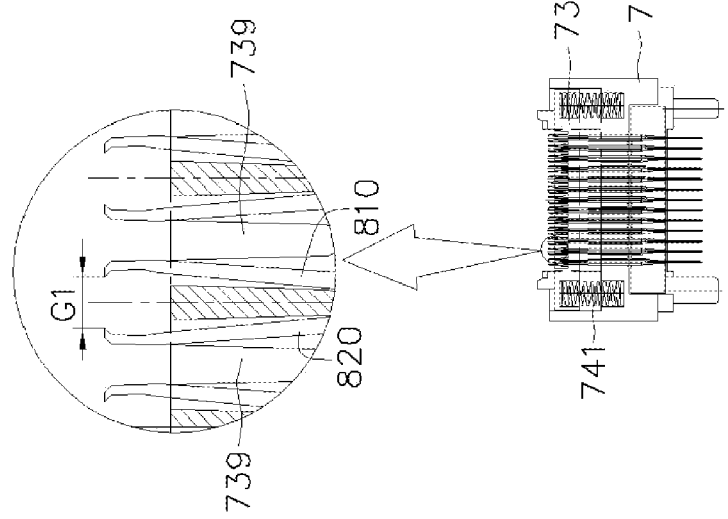

FIGS. 36(a), 36(b), and 36(c) are views illustrating a contact process of a solder ball of an IC and a contact in the socket device according to the third embodiment of the present disclosure.

FIG. 36(a) illustrates an initial state of the socket device, in which the IC loading/unloading device is detached from the main body 710, which is the step before loading the IC. The slider 730 is in a state of being located upward by being elastically supported by the contact force generating springs 741. The first terminal 810 and the second terminal 820 of each of the contacts are in a state of being in contact with neighboring closing movable pieces 739, respectively. Herein, the gap G1 between the upper tips 812 and 822 of the contact is smaller than the diameter of the solder ball 2.

Referring to FIG. 36(b), when the IC loading/unloading device 900 is assembled to the upper portion of the main body 710 by fitting, the slider actuating pins 91 press the slider 730 downward while coming into contact with the upper surface of the slider 730, causing the opening movable pieces 737 to be inserted between the respective terminals 810 and 820. The terminals 810 and 820 are opened to become a state in which the gap G2 between the upper tips 812 and 822 of each of the contacts is greater than the diameter of the solder ball 2, whereby the IC 1 is loaded onto the socket device.

Referring to FIG. 36(c), when the IC loading/unloading device 900 is detached from the main body 710 after the IC 1 is loaded onto the socket device, the slider 730 is moved upward to be returned to an original position thereof by a compressive force of the contact force generating springs 741, causing the terminals 810 and 820 to be closed inward, whereby the solder balls 2 come into contact with the upper tips 812 and 822 of the contacts by an appropriate contact force.

Fourth Embodiment

Figure 37:
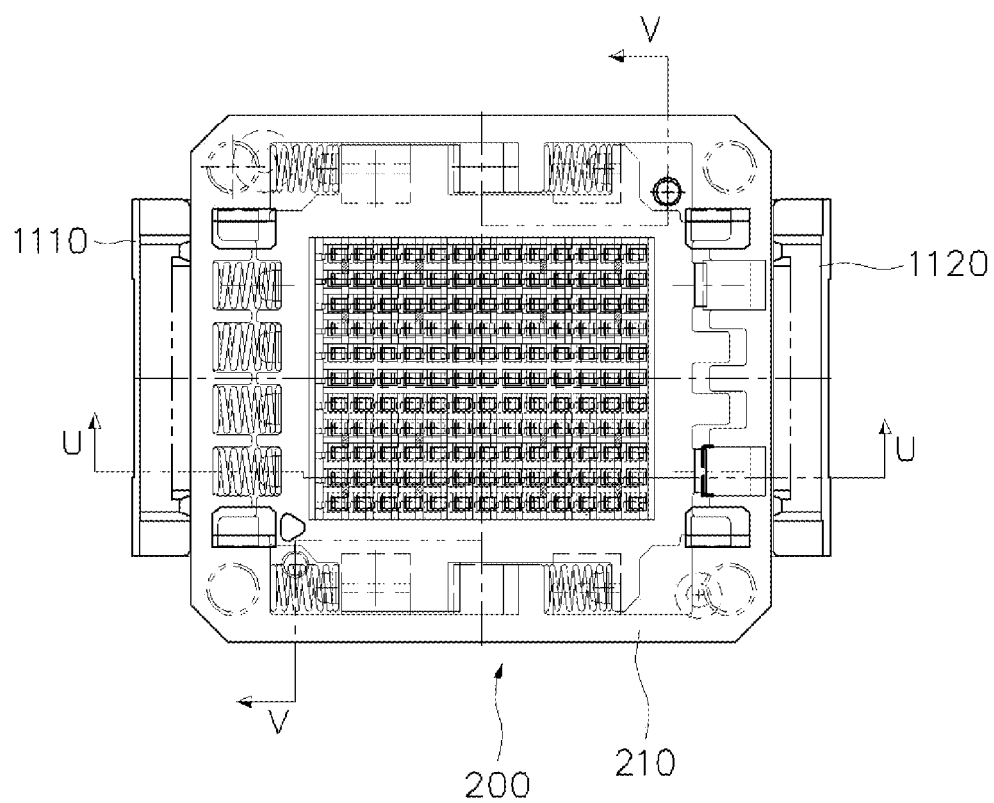
FIG. 37 is a plan view illustrating a lidless BGA socket device according to a fourth embodiment of the present disclosure.
Figure 38A:
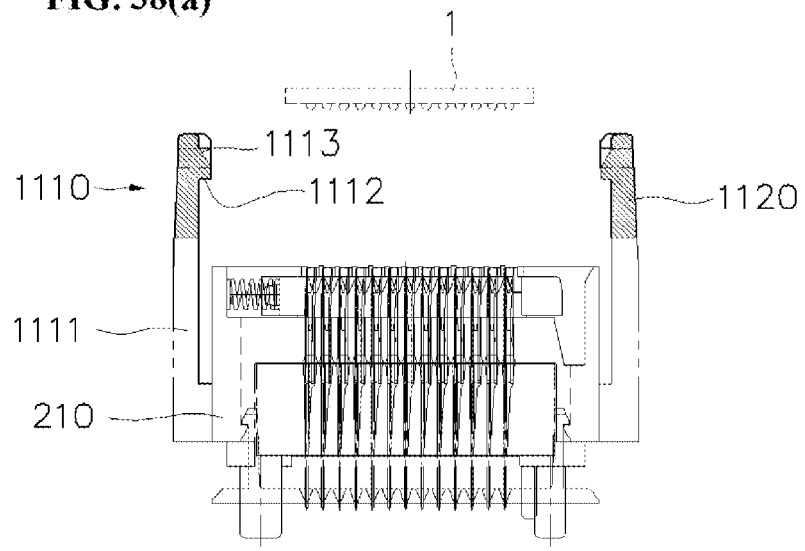
FIGS. 38(a) and 38(b) are cross-sectional views taken along line U-U and line V-V in FIG. 37, respectively.
Figure 38B:
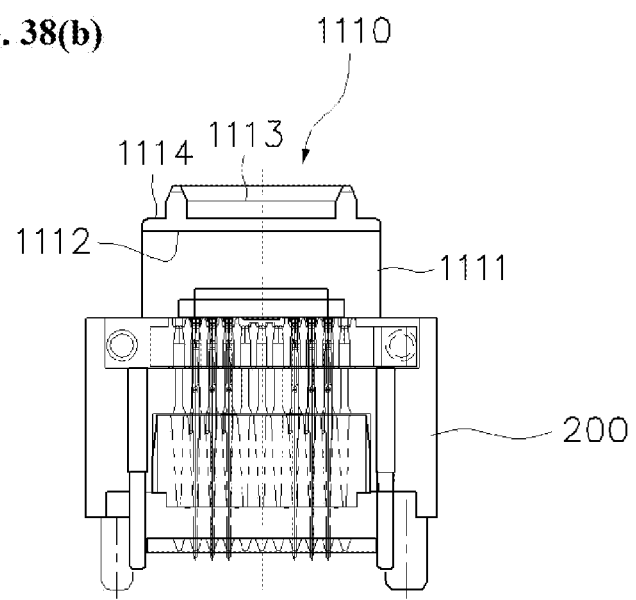

FIG. 37 is a plan view illustrating a lidless BGA socket device according to a fourth embodiment of the present disclosure, and FIGS. 38(a) and 38(b) are cross-sectional views taken along line U-U and line V-V in FIG. 37, respectively.

Referring to FIGS. 37 to 38, a socket device of the present embodiment may include a heat sink unit detachably provided and capable of effectively dissipating heat generated by an IC 1 during testing of the IC 1. For reference, the heat sink unit may be equally applied to the socket devices of the first, second, and third embodiments described above. A following description will be given on the basis of the socket device of the first embodiment.

In detail, a main body 210 includes a pair of locking arms 1110 and 1120 that are vertically provided at opposite ends thereof to be assembled to the heat sink unit by fitting.

The locking arms 1110 and 1120 include a first locking arm 1110 and a second locking arm 1120 that are bilaterally symmetrically provided at the opposite ends of the main body 210. A following description will be given on the basis of the first locking arm 1110.

The first locking arm 1110 includes a plate-shaped arm plate 1111 provided vertically at a side end of the main body 210, a locking end 1112 protruding inward from an upper end of the arm plate 1111, and a release groove 1113 depressed outward from the upper end of the arm plate 1111.

The arm plate 1111 constituting the first locking arm 1110 may be a structure manufactured integrally with the main body 210 or a structure assembled to the main body 210 by a fastening means such as a bolt. The first locking arm 1110 may be separately fixed to a PCB to which the main body is fixed rather than being directly fixed to the main body.

The locking end 1112 protrudes inward from the upper end of the arm plate 1111. The locking end 1112 is locked to a hook protrusion provided at the heat sink unit. The release groove 1113 is depressed outward from the upper end of the arm plate 1111. The release groove 1113 is used for unlocking of the heat sink unit.

It is preferable that the arm plate 1111 includes a horizontal flange seat surface 1114 allowing a flange of the heat sink unit to be seated thereon.

The pair of locking arms 1110 and 1120 provided bilaterally symmetrically as described above and the heat sink unit are detachably assembled together, and the heat sink unit dissipates heat generated from the IC during testing to prevent the IC from overheating.

Figure 39:
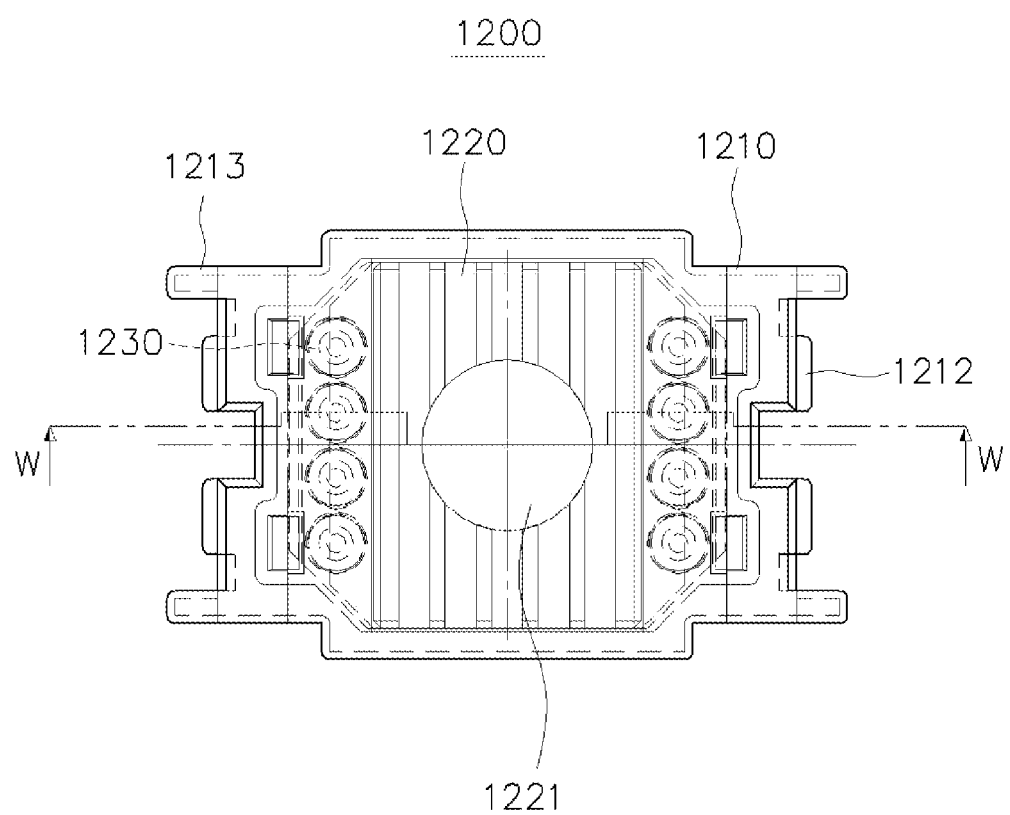
FIG. 39 is a plan view illustrating a heat sink unit according to an embodiment of the present disclosure.
Figure 40A:
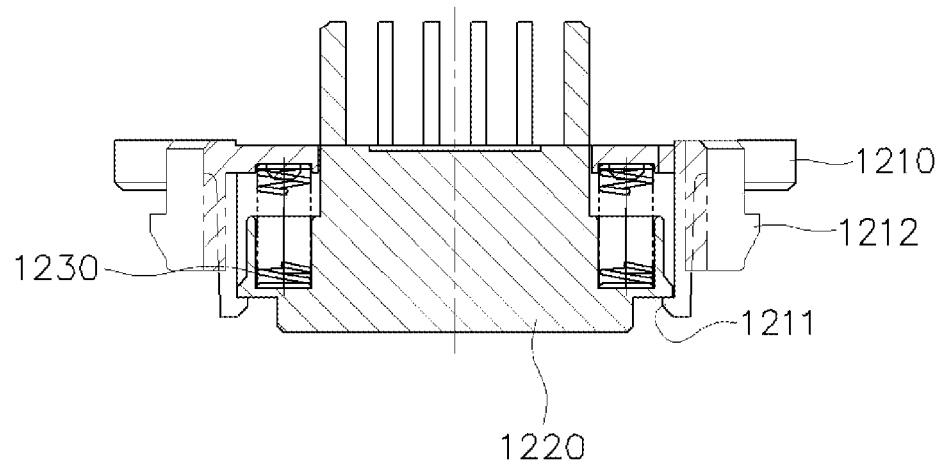
FIGS. 40(a) and 40(b) are a cross-sectional view and an exploded cross-sectional view, respectively, taken along line W-W in FIG. 39.
Figure 40B:
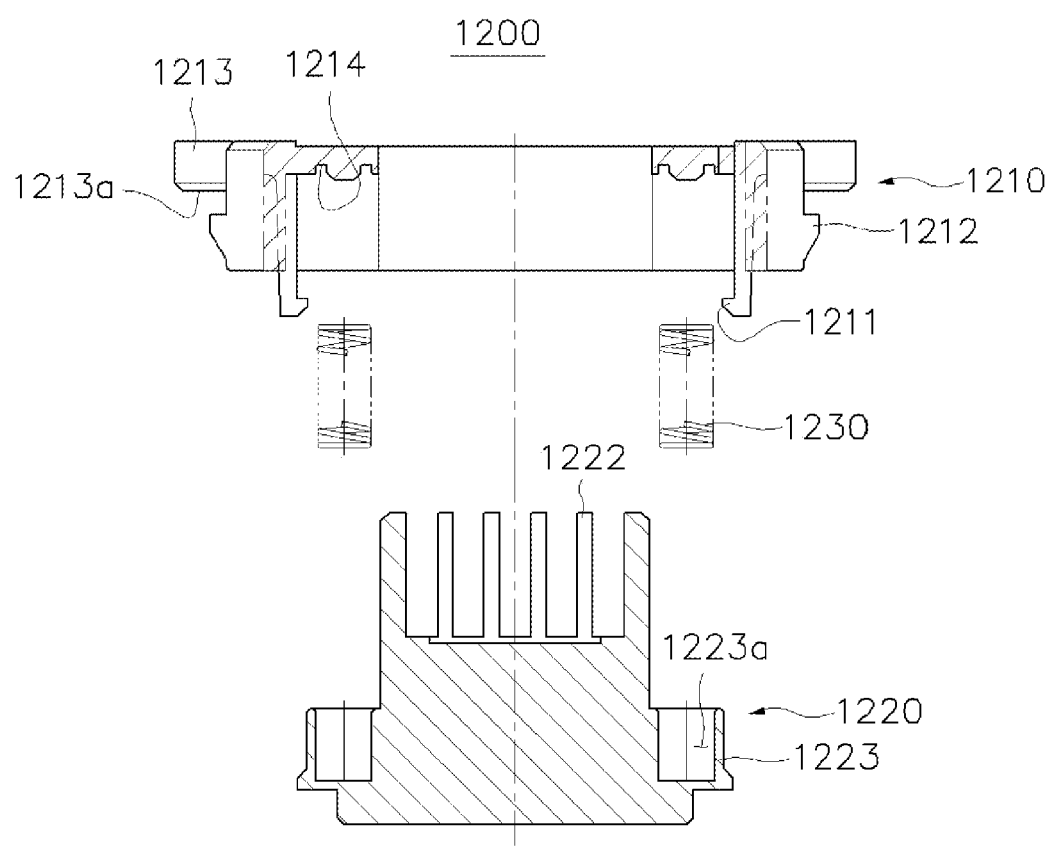

FIG. 39 is a plan view illustrating a heat sink unit according to an embodiment of the present disclosure, and FIGS. 40(a) and 40(b) are a cross-sectional view and an exploded cross-sectional view, respectively, taken along line W-W in FIG. 39.

Referring to FIGS. 39 to 40, a heat sink unit according to the present embodiment has a bilaterally symmetrical structure, and thus a following description will be given one side thereof. A heat sink unit 1200 includes: a housing 1210 including an opening formed therethrough, a first hook protrusion 1211 protruding downward from a peripheral portion of the opening, and a second hook protrusion 1212 fitted and locked to each of the locking arms; a heat sink 1220 inserted into the opening so as to be movable upward and downward, and having a moving distance that is limited by the first hook protrusion 1211; and a spring 1230 interposed between the housing 1210 and the heat sink 1220, and elastically supporting the heat sink 1220 downward.

The opening of the housing 1210 is formed through the center thereof such that the heat sink 1220 is inserted into the opening. The first hook protrusion 1211 protrudes downward from a peripheral portion of the opening to be locked to a lower end of the heat sink 1220. The housing 1210 includes the second hook protrusion 1212 extending downward an end thereof. The second hook protrusion 1212 is locked to the locking end 1112 (see FIGS. 38(a) and 38(b)) of the locking arm 1110. It is preferable that the first hook protrusion 1211 is located below the second hook protrusion 1212.

It is preferable that the housing 1210 includes a flange 1213 extending from an end thereof and including a lower surface 1213a. The lower surface 1213a of the flange 1213 is allowed to be seated on the flange seat surface 1114 (see FIGS. 38(a) and 38(b)) of the locking arm 1110.

The heat sink 1220 may include multiple cooling fins 1222 provided at a block-shaped body thereof. It is preferable that a flat portion 1221 having a predetermined area is provided at the center of an upper surface of the heat sink 1220. The flat portion 1221 may be used for vacuum pick-up during loading/unloading of the heat sink unit 1200.

The spring 1230 is interposed between the housing 1210 and the heat sink 1220 to elastically support the heat sink 1220 downward. The spring 1230 may be a known coil spring.

Meanwhile, the heat sink 1220 includes a spring receiving portion 1223. The spring receiving portion 1223 includes a receiving hole 1223a into which the spring 1230 inserted. In the present embodiment, the first hook protrusion 1211 is locked to a lower end of the spring receiving portion 1223. An upper end of the spring 1230 is inserted into a spring seat groove 1214 formed in a lower surface of the housing 1210.

Figure 41B:
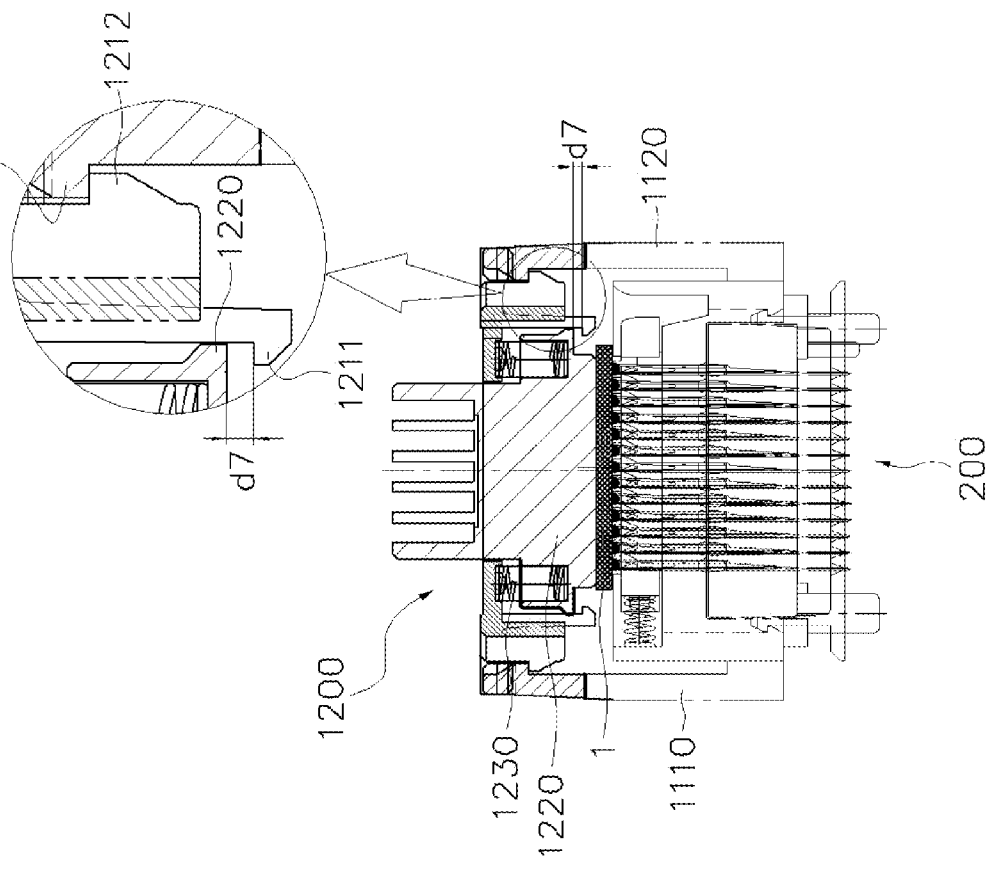
FIGS. 41(a) and 41(b) are cross-sectional views illustrating before and after loading of the heat sink unit, respectively.
Figure 41A:
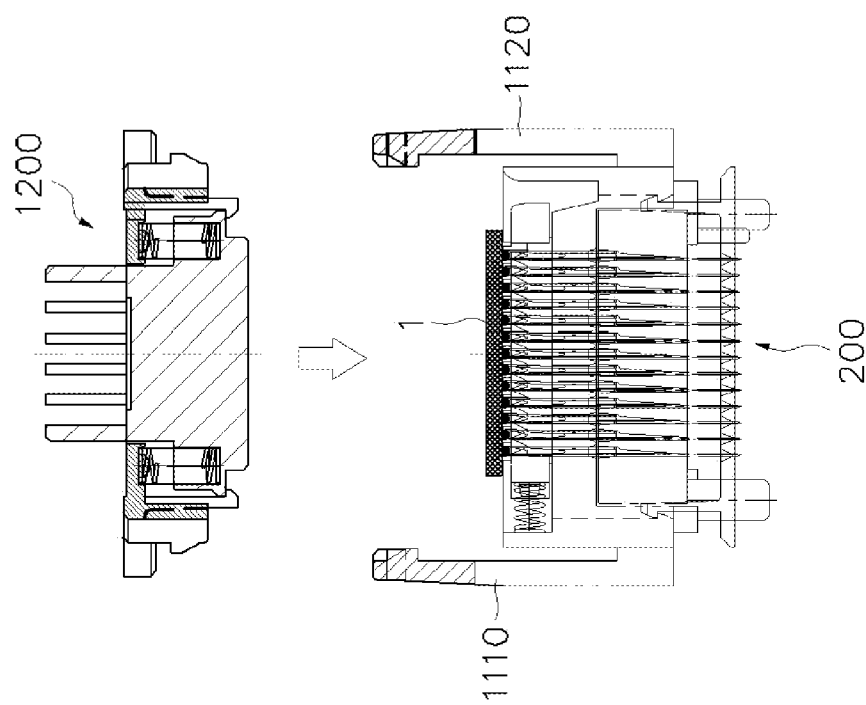

FIGS. 41(a) and 41(b) are cross-sectional views illustrating before and after loading of the heat sink unit, respectively.

Referring to FIG. 41(a), the IC 1 is loaded onto the socket device 200, and loading of the IC 1 is performed by the IC loading/unloading device described above.

As shown in FIG. 41(b), when the heat sink unit 1200 is mounted to the socket device 200 from thereabove, the heat sink unit 1200 is locked thereto by the first and second locking arms 1110 and 1120.

A detailed description will be given on the basis of the second fixed arm 1120. The second hook protrusion 1212 is locked to the locking end 1122 of the second locking arm 1120. Herein, the heat sink 1220 comes into contact with an upper surface of the IC 1, and the first hook protrusion 1211 and the heat sink 1220 are distanced by a predetermined distance d7, with the spring 1230 compressed by a length equal to the distance D7, whereby the heat sink 1220 and the IC 1 come into close contact with each other by a compression force of the spring 1230. This ensures that during testing of the IC 1, the IC 1 maintains contact with the heat sink 1220 in a pressed state, and heat dissipation is more efficiently performed.

Figure 42A:
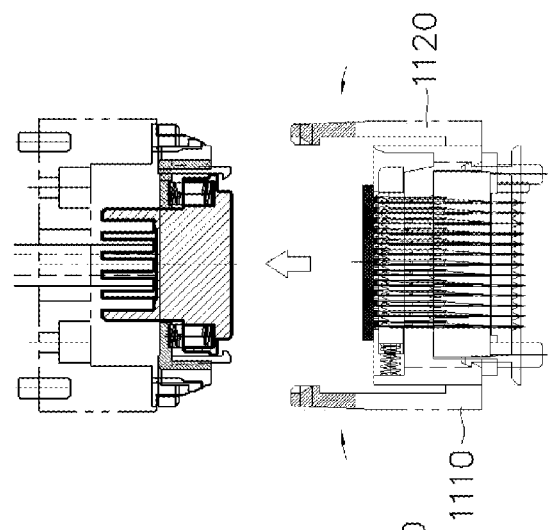
FIGS. 42(a), 42(b), and 42(c) are cross-sectional views schematically illustrating an unloading process of the heat sink unit.
Figure 42B:
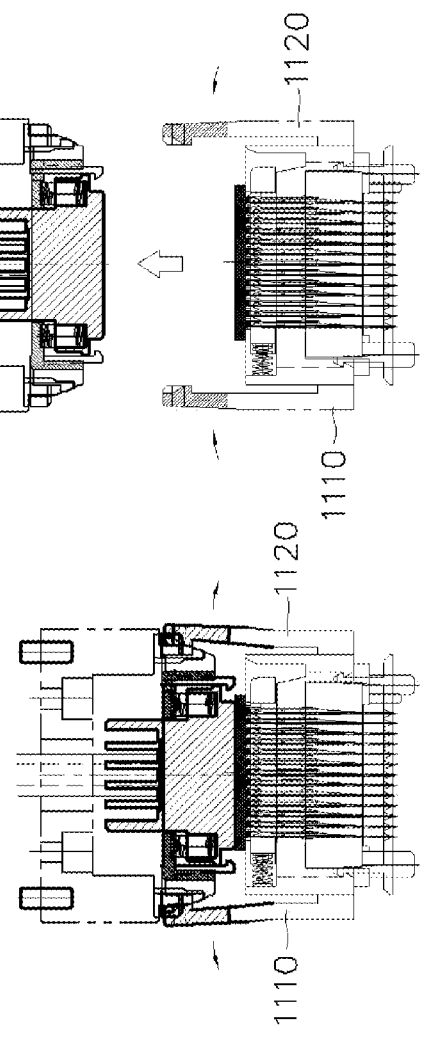
Figure 42C:
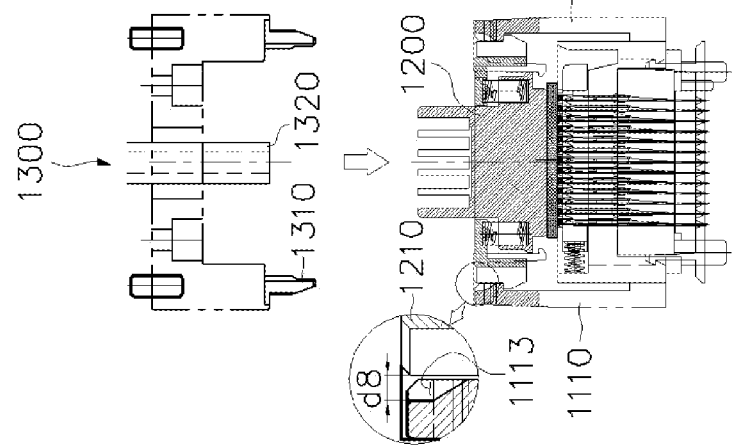

FIGS. 42(a), 42(b), and 42(c) are cross-sectional views schematically illustrating an unloading process of the heat sink unit.

Referring to FIG. 42, a heat sink unloading device 1300 may be provided separately for unloading of the heat sink unit 1200. The heat sink unloading device 1300 may include unloading cams 1310 and a vacuum pick-up mechanism 1320. An unloading cam 1310 corresponding to the first locking arm 1110 is moved downward to be inserted between the first locking arm 1110 and the housing 1210 of the heat sink unit 1200 to open the first locking arm 1110 outward, thus releasing locking between the locking end of the first locking arm 1110 and the first hook protrusion of the heat sink unit 1200.

Meanwhile, provision of the release groove 1113 depressed outward from the upper end of the first locking arm 1110 ensures to secure a sufficient gap d8 between the first locking arm 1110 and the heat sink unit 1200, such that the unloading cam 1310 is easy to insert thereinto.

The vacuum pick-up mechanism 1320 is located on the flat portion 1221 (see FIG. 39) provided on the upper surface of the heat sink 1220 and picks up the heat sink unit 1200 by vacuum.

Figure 43A:
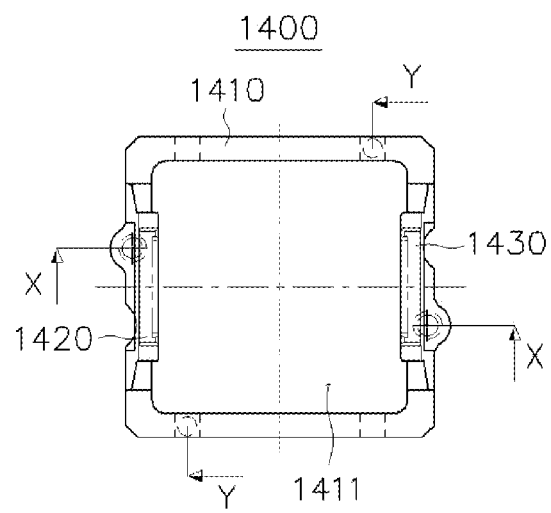
FIGS. 43(a), 43(b), and 43(c) are a plan view illustrating a heat sink socket and cross-sectional views taken along line X-X and line Y-Y, respectively, which are modifications for mounting the heat sink unit to the socket device.
Figure 43B:
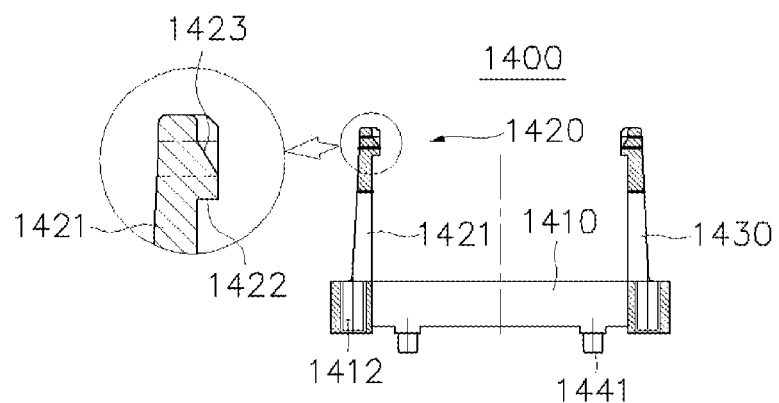
Figure 43C:
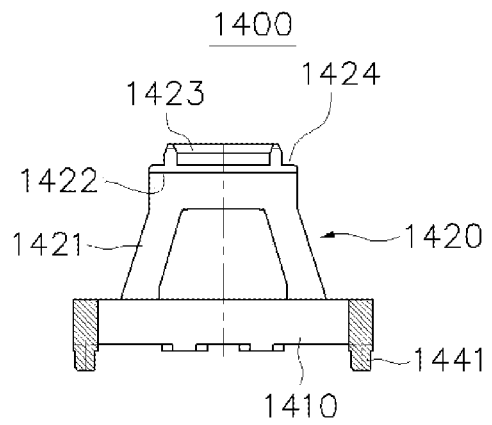

FIGS. 43(a), 43(b), and 43(c) are a plan view illustrating a heat sink socket and cross-sectional views taken along line X-X and line Y-Y, respectively, which are modifications for mounting the heat sink unit to the socket device. For reference, the same heat sink unit described above is used in a heat sink socket of the present embodiment.

Referring to FIG. 43, a heat sink socket 1400 of the present embodiment includes a frame 1410 fixed to a PCB and having a quadrangular shape with an opening, and a pair of locking arms 1420 and 1430 extending vertically from opposite sides of the frame 1410, respectively, and allowed to be assembled to the heat sink unit by fitting.

The frame 1410 has a quadrangular shape in which an opening 1411 is formed in the center thereof to allow the socket device to be placed therein and includes multiple screw holes 1412 for screwing the frame 1410 to a PCB. The frame 1410 includes the pair of locking arms 1420 and 1430 extending upward from the opposite sides thereof, and a second guide pin 1442 protruding downward. The second guide pin 1442 guides a correct assembly position of the frame 1410 with a PCB during assembly with the PCB. One or multiple guide pins 1441 may be provided. Although not shown in the drawings, the frame 1410 may further include a separate soldering pin that is soldered to a PCB.

The locking arms 1420 and 1430 include a first locking arm 1420 and a second locking arm 1430 bilaterally symmetrically provided at the opposite sides of the frame 1410. A following description will be given on the basis of the first locking arm 1420.

The first locking arm 1420 includes an arm member 1421 extending vertically from the frame 1410, a locking end 1422 protruding inward from an upper end of the arm member 1421, and a release groove 1423 depressed outward from the upper end of the arm member 1421.

The locking end 1422 protrudes inward from the upper end of the arm member 1421. The locking end 1422 is locked to a hook protrusion provided at the heat sink unit. The release groove 1423 is depressed outward from the upper end of the arm member 1421. The release groove 1423 is used for unlocking of the heat sink unit.

It is preferable that the arm member 1421 includes a horizontal flange seat surface 1424 provided at a portion of the upper end thereof and allowing a flange of the heat sink unit to be seated thereon.

The pair of locking arms 1420 and 1430 provided bilaterally symmetrically as described above and the heat sink unit are detachably assembled together.

Figure 44A:
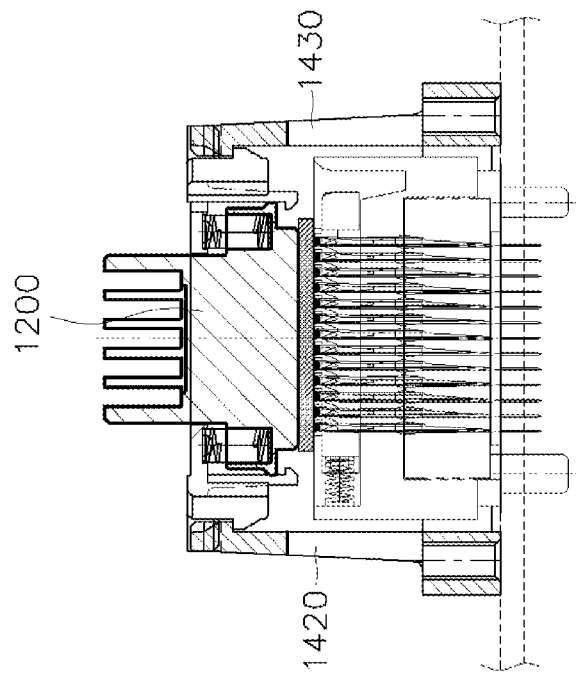
FIGS. 44(a) and 44(b) are cross-sectional views illustrating before and after loading of the heat sink unit using the heat sink socket of FIG. 43, respectively.
Figure 44B:
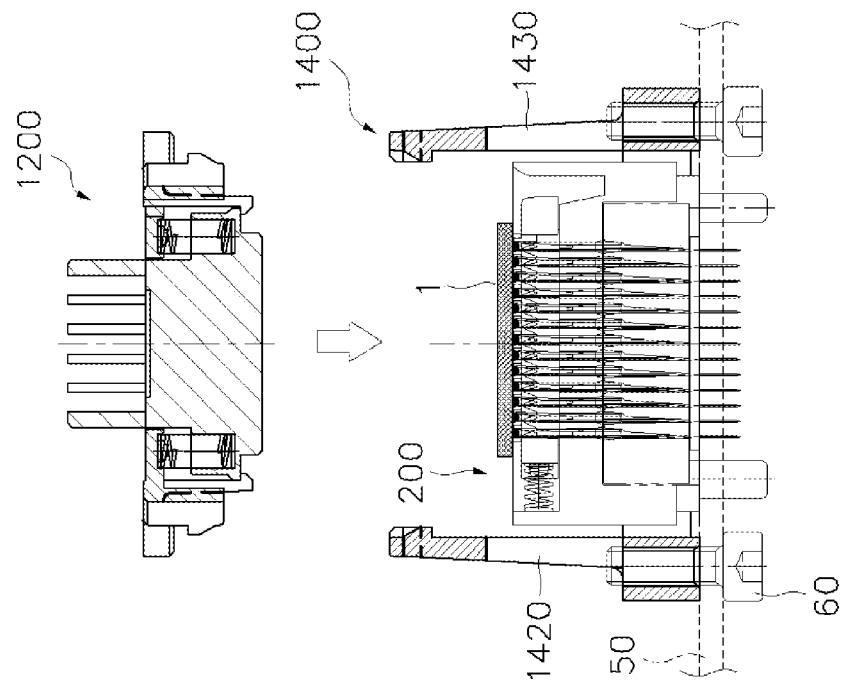

FIGS. 44(a) and 44(b) are cross-sectional views illustrating before and after loading of the heat sink unit using the heat sink socket of FIG. 43, respectively. The heat sink socket 1400 is assembled to a PCB 50, to which the socket device 200 is assembled, by screws 60, and then the heat sink unit 1200 is locked by the pair of locking arms 1420 and 1430 of the heat sink socket 1400.

Meanwhile, loading and unloading of the heat sink 1200 by the locking arms 1420 and 1430 of the heat sink socket 1400 are performed in the same manner as in the foregoing embodiments.

Although the exemplary embodiments of the present disclosure have been described for illustrative purposes, those skilled in the art will appreciate that various modifications, additions, and substitutions are possible, without departing from the scope and spirit of the disclosure as disclosed in the accompanying claims.

DESCRIPTION OF THE REFERENCE NUMERALS IN THE DRAWINGS 100, 400, 600, 800: contact
200, 500, 700: socket device
210, 510, 710: main body
210a: upper surface
210b: slider receiving portion
211: guide hole
212a: cam supporting portion
213: first receiving hole
214: fixed piece 215: guide pin
216: first locking protrusion
220, 520, 720: stopper body
230, 530, 730: slider
231: cam contact portion
232: locking hook
233: spring locking guide
234: fixed terminal receiving hole
235: movable terminal receiving hole
236: solder ball guide
237: opening/closing movable piece
237a: opening pressure end
237b: closing pressure end
238: distance maintaining movable piece
241, 541, 741: contact force generating spring
250: lead guide
300, 900: IC loading/unloading device
310: body portion
311: receiving hole
312: guide arm
313: slider actuating cam
314: guide inner surface
315: IC guide inclined surface
1110, 1120: locking arm
1200: heat sink unit
1300: heat sink unloading device
1400: heat sink socket

The invention claimed is:

1. A lidless BGA socket device for testing a BGA IC, the lidless BGA socket device comprising:
   a contact having an elastic force exerted in a lateral direction and including an upper tip, the contact coming into electrical contact with each solder ball of the IC;
   a main body including a slider receiving portion depressed in a horizontal upper surface thereof for seating the IC, and a cam supporting portion formed in the upper surface at a location corresponding to a peripheral portion of the slider receiving portion to define an end inner surface, the main body being configured such that the contact is fixed to a lower surface of the slider receiving portion;
   a slider enabling forward and backward sliding in a horizontal direction in the slider receiving portion, and including a cam contact portion provided at an end thereof while facing the cam supporting portion such that the forward and backward sliding is performed in response to a lateral operating force applied to the cam contact portion, the slider transmitting the lateral operating force to the contact in accordance with forward and backward sliding positions thereof to allow the solder ball of the IC and the contact to come into contact with each other;
   a contact force generating spring provided between the main body and the slider, and elastically supporting the slider in a moving direction to provide a contact force between the contact and the solder ball of the IC; and
   wherein uppermost ends of the main body and the slider are lower than at least a height of the loaded IC.

2. The lidless BGA socket device of claim 1, further comprising: an IC loading/unloading device detachably assembled to an upper end of the main body by fitting, and inserted between the cam supporting portion and the cam contact portion to provide the lateral operating force to the slider.

3. The lidless BGA socket device of claim 2, wherein the IC loading/unloading device includes:
   a body portion including an opening; and
   a slider actuating cam extending from a lower end of the body portion and inserted between the cam supporting portion and the cam contact portion.

4. The lidless BGA socket device of claim 3, wherein the slider actuating cam includes a lower end portion having a wedge shape with a curved or inclined surface.

5. The lidless BGA socket device of claim 1, wherein the contact includes:
   a pair of fixed terminal and movable terminal provided to face each other in parallel relation in which each of the fixed and movable terminals includes the upper tip provided at an upper end thereof such that the upper tips are disposed to be offset from each other with respect to the solder ball of the IC;
   a contact body to which lower ends of the fixed terminal and the movable terminal are integrally fixed; and
   a lead extending downward from the contact body.

6. The lidless BGA socket device of claim 5, wherein the slider includes:
   a fixed terminal receiving hole and a movable terminal receiving hole in which the fixed and movable terminals of the contact are received, respectively, by passing therethrough,
   wherein the fixed terminal receiving hole and the movable terminal receiving hole are offset from each other by a distance equal to an offset distance between the upper tips of the fixed terminal and the movable terminal, and the fixed terminal receiving hole is longer in length than the movable terminal receiving hole.

7. The lidless BGA socket device of claim 6, wherein the contact is provided as multiple contacts, and the slider includes:
   multiple movable terminal receiving holes corresponding to the contacts; and
   an opening/closing movable piece provided between neighboring movable terminal receiving holes, and including an opening pressure end pressing the movable terminal in an opening direction and a closing pressure end pressing the movable terminal in a closing direction.

8. The lidless BGA socket device of claim 7, wherein the slider further includes a distance maintaining movable piece provided between neighboring fixed terminal receiving holes, and supporting an inner surface of the fixed terminal so as to maintain a minimum distance between the upper tips of the fixed and movable terminals.

9. The lidless BGA socket device of claim 8, further comprising:
   a solder ball guide provided on an upper surface of the slider and guiding a seat position of the solder ball.

10. The lidless BGA socket device of claim 1, wherein the contact includes:
    a single pin type terminal including the upper tip provided at an upper end thereof;
    a contact body to which a lower end of the terminal is integrally fixed; and
    a lead extending downward from the contact body.

11. The lidless BGA socket device of claim 10, further comprising:
    a solder ball guide provided on an upper surface of the slider and guiding a seat position of the solder ball of the IC.

12. The lidless BGA socket device of claim 11, wherein the contact is provided as multiple contacts, and the slider includes:

multiple terminal receiving holes corresponding to the contacts and in which the terminal of each of the contacts is located by passing therethrough; and a distance maintaining movable piece protruding downward between neighboring terminal receiving holes, wherein an end of the distance maintaining movable piece supports the terminal of the contact so as to maintain a minimum distance between the solder ball guide and the upper tip of the contact smaller than a diameter of the solder ball of the IC.

13. A lidless BGA socket device for testing a BGA IC, the lidless BGA socket device comprising:

a contact having an elastic force exerted in a lateral direction and including an upper tip, the contact coming into electrical contact with each solder ball of the IC;

a main body including an IC seat portion provided on a horizontal upper surface thereof and allowing the IC to be seated thereon, and a slider receiving portion depressed in the upper surface, the main body being configured such that the contact is fixed to a lower surface of the slider receiving portion;

a slider received in the slider receiving portion so as to be slidable upward and downward and enabling upward and downward sliding in response to application of a vertical operating force applied to the slider in a vertical direction, the slider transmitting a lateral operating force to the contact in accordance with upward and downward sliding positions thereof to allow the contact and each solder ball of the IC to come into contact with each other; and a contact force generating spring provided between the main body and the slider, and elastically supporting the slider in a moving direction to provide a contact force between the contact and the solder ball of the IC.

14. The lidless BGA socket device of claim 13, further comprising:

an IC loading/unloading device detachably assembled to an upper end of the main body by fitting, and pressing an upper surface of the slider to provide the vertical operating force to the slider.

15. The lidless BGA socket device of claim 14, wherein the IC loading/unloading device includes:

a body portion including an opening; and a slider actuating pin extending from a lower end of the body portion and pressing the upper surface of the slider.

16. The lidless BGA socket device of claim 14, wherein the contact includes:

a first terminal and a second terminal provided bilaterally symmetrically in the form of pins, and configured such that each of the first and second terminals includes an upper tip provided at an upper end thereof;

a contact body to which lower ends of the first and second terminals are integrally fixed; and a lead extending downward from the contact body, wherein each of the first and second terminals includes a bending point provided at a predetermined height, and a distance between the bending points of the terminals is smaller than a distance between the upper tips of the terminals.

17. The lidless BGA socket device of claim 16, wherein the contact is provided as multiple contacts, and the slider includes first terminal receiving holes and second terminal receiving holes that are arranged at a regular interval correspondingly to the contacts such that the first terminal and the second terminal of each of the contacts are inserted in each of the first terminal receiving holes and each of the second terminal receiving holes, respectively, wherein each of the first terminal receiving holes and each of the second terminal receiving holes are defined by movable pieces that are disposed at locations inside and outside the first terminal and the second terminal and protrude downward.

18. The lidless BGA socket device of claim 17, wherein the slider further includes a solder ball guide provided on the upper surface of the slider and guiding a seat position of the solder ball of the IC.

19. The lidless BGA socket device of claim 5, wherein the lead includes a curved portion.

20. The lidless BGA socket device of claim 1, wherein the main body further includes a pair of locking arms vertically provided at opposite ends thereof, and assembled to a heat sink unit by fitting.

21. The lidless BGA socket device of claim 20, further comprising:

a heat sink unit locked by the locking arms, and dissipating heat of a loaded IC in a state of being in contact therewith.

22. The lidless BGA socket device of claim 21, wherein the heat sink unit includes:

a housing including an opening formed therethrough, a first hook protrusion protruding downward from a peripheral portion of the opening, and a second hook protrusion fitted and locked to each of the locking arms;

a heat sink inserted into the opening so as to be movable upward and downward, and having a moving distance that is limited by the first hook protrusion; and a spring interposed between the housing and the heat sink, and elastically supporting the heat sink downward.

23. A heat sink unit for a socket device according to claim 1, the heat sink unit being assembled to a socket device for testing an IC so as to dissipate heat of the IC, and comprising:

a housing including an opening formed therethrough, a first hook protrusion protruding downward from a peripheral portion of the opening, and a second hook protrusion fitted and locked to the socket device;

a heat sink inserted into the opening so as to be movable upward and downward, and having a moving distance that is limited by the first hook protrusion; and a spring interposed between the housing and the heat sink, and elastically supporting the heat sink downward.

24. The heat sink unit of claim 23, wherein the first hook protrusion is located below the second hook protrusion.

25. A heat sink socket for mounting a heat sink unit for heat dissipation of an IC to a socket device according to claim 1 that is used for testing the IC and assembled to a PCB, the heat sink socket comprising:

a frame fixed to the PCB, and having a quadrangular shape in which an opening is formed to allow the socket device to be placed therein; and a pair of locking arms extending upward from opposite sides of the frame, respectively, and allowed to be assembled to the heat sink unit by fitting, wherein each of the locking arms includes:

an arm member extending vertically from the frame;

a locking end protruding inward from an upper end of the arm member; and a release groove depressed outward from the upper end of the arm member.

26. The lidless BGA socket device of claim 10, wherein the lead includes a curved portion.

27. The lidless BGA socket device of claim 16, wherein the lead includes a curved portion.

28. The lidless BGA socket device of claim 13, wherein the main body further includes a pair of locking arms vertically provided at opposite ends thereof and assembled to a heat sink unit by fitting.

29. The lidless BGA socket device of claim 28, further comprising:
   a heat sink unit locked by the locking arms, and dissipating heat of a loaded IC in a state of being in contact therewith.

30. The lidless BGA socket device of claim 29, wherein the heat sink unit includes:
   a housing including an opening formed therethrough, a first hook protrusion protruding downward from a peripheral portion of the opening, and a second hook protrusion fitted and locked to each of the locking arms;
   a heat sink inserted into the opening so as to be movable upward and downward, and having a moving distance that is limited by the first hook protrusion; and
   a spring interposed between the housing and the heat sink, and elastically supporting the heat sink downward.

* * * * *

UNITED STATES PATENT AND TRADEMARK OFFICE
CERTIFICATE OF CORRECTION

PATENT NO. : 12,248,001 B2  
APPLICATION NO. : 17/441512  
DATED : March 11, 2025  
INVENTOR(S) : Hwang et al.

Page 1 of 1

It is certified that error appears in the above-identified patent and that said Letters Patent is hereby corrected as shown below:

On the Title Page

In Item (73), under "Assignees", Line 2, delete "Dong Hwang" and insert -- Dong Weon Hwang --, therefor.

In Item (73), under "Assignees", Line 3, delete "Hwang Jae" and insert -- Logan Jae Hwang --, therefor.

In Item (73), under "Assignees", Line 4, delete "Hwang Baek" and insert -- Jae Baek Hwang --, therefor.

Signed and Sealed this  
Twenty-second Day of April, 2025

Coke Morgan Stewart  
*Acting Director of the United States Patent and Trademark Office*